(12) United States Patent
Degerstrom et al.

(10) Patent No.: US 8,860,431 B2
(45) Date of Patent: Oct. 14, 2014

(54) APPLICATION OF OPEN AND/OR SHORT STRUCTURES TO BISECT DE-EMBEDDING

(75) Inventors: Michael J. Degerstrom, Rochester, MN (US); Erik S. Daniel, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 670 days.

(21) Appl. No.: 13/155,205

(22) Filed: Jun. 7, 2011

(65) Prior Publication Data
US 2011/0298476 A1 Dec. 8, 2011

Related U.S. Application Data

(60) Provisional application No. 61/352,159, filed on Jun. 7, 2010.

(51) Int. Cl.
*G01R 35/00* (2006.01)
*G01R 27/32* (2006.01)

(52) U.S. Cl.
CPC ............... *G01R 27/32* (2013.01); *G01R 35/00* (2013.01)
USPC .......................................... 324/601; 324/615

(58) Field of Classification Search
CPC ............................ G01R 27/32; G01R 35/00
USPC ...................... 324/601, 615; 702/107, 106
See application file for complete search history.

(56) References Cited

U.S. PATENT DOCUMENTS

| | | | |
|---|---|---|---|
| 6,665,628 B2* | 12/2003 | Martens | 702/117 |
| 7,511,508 B2* | 3/2009 | Haruta et al. | 324/538 |
| 7,643,957 B2* | 1/2010 | Daniel | 702/109 |

OTHER PUBLICATIONS

Eric S. Daniel et al., "Network Analyzer Measurement De-embedding Utilizing a Distributed Transmission Matrix Bisection of a Single THRU Structure", Mar. 8, 2004, Mayo Clinic, 8 pgs.
Hanjin Cho et al., "Thee-Step Method for the De-Embedding of High-Frequency S-Parameter Measurements", IEEE Transactions on Electron Devices, vol. 38, No. 6, Jun. 1991, 5 pgs.
Glenn F. Engen et al., "Thru-Reflect-Line", An Improved Technique for Calibrating the Duel Six-Port Automatic Network Analyzer, IEEE Transactions Microwave Theory and Techniques, vol. MTT-27, No. 12, Dec. 1979, 7 pgs.
Yungseon Eo et al., "High-Speed VLSI Interconnect Modeling Based on on S-Parameter Measurements", IEEE Transactions on Components, Hybrids, and Manufacturing Technology, vol. 16, No. 5, Aug. 1993, 8 pgs.
QuingQing Liang et al., "A Simple Four-Port Parasitic Deembedding Methodology For High-Frequency Scattering Parameter and Noise Characterization of SiGe HBTs", IEEE Transactions on Microwave Theory and Techniques, vol. 51, No. 11, Nov. 2003, 10 pgs.

(Continued)

*Primary Examiner* — Arleen M Vazquez
*Assistant Examiner* — Alesa Allgood
(74) *Attorney, Agent, or Firm* — Shumaker & Sieffert, P.A.

(57) ABSTRACT

Application of open and short structures may result in improved accuracy in determination of ABCD parameters of a substantially symmetric two-port network for purposes of bisect de-embedding. Either one or both of the open and/or short techniques may be used to improve results of an ABCD optimization algorithm. Bisect de-embedding may then be performed to determine the ABCD parameters of a device under test based on the ABCD parameters of the substantially symmetric two-port network and measured s-parameters of the substantially symmetric two-port network and the embedded device under test.

17 Claims, 26 Drawing Sheets

(56) References Cited

OTHER PUBLICATIONS

Holger Heuermann et al. "Line Network Network (LNN): An Alternative in-Fixture Calibration Procedure", IEEE Transactions on Microwave Theory and Techniques, vol. 45, No. 3, Mar. 1997, 6 pgs.

Eric S. Daniel et al., "A Two-Port Network Bisection Method with Application to De-embedding of Network Analyzer Measurements", ARFTG Special Issue Submission ARF-63-24, 2004, 10 pgs.

Luuk F. Tiemeijer et al., "A Calibrated Lumped-Element De-embedding Technique for On-Wafer RF Characterization of High-Quality Inductors and High-Speed Transistors", IEEE Transactions on Electron Devices, vol. 50, No. 3, Mar. 2003, 8 pgs.

Miguel Urteaga et al., "Power Gain Singularities in Transferred-Substrate InA1As—InGaAs-HBTs", IEEE Transactions on Electron Devices, vol. 50, No. 7, Jul. 2003, 10 pgs.

Dylan F. Williams et al., "An Optimal Multiline TRL Calibration Algorithm", IEEE MTT-S Digest, 2003, 4 pgs.

Dylan F. Williams, "Accurate Characterisitc Impedance Measurement on Silicon", IEEE MTT-S Digest, 1998, 4 pgs.

Dylan F. Williams et al., "An Optimal Vector-Network-Analyzer Calibration Algorithm", EEE Transactions on Microwave Theory and Techniques, vol. 51, No. 12 Dec. 2003, 11 pgs.

Dylan F. Williams et al., "Comparison of On-Wafer Calibrations", 38th ARFTG Conference Digest, Dec. 1991, 13 pgs.

\* cited by examiner

—— THRU
······ Bisected Half of THRU

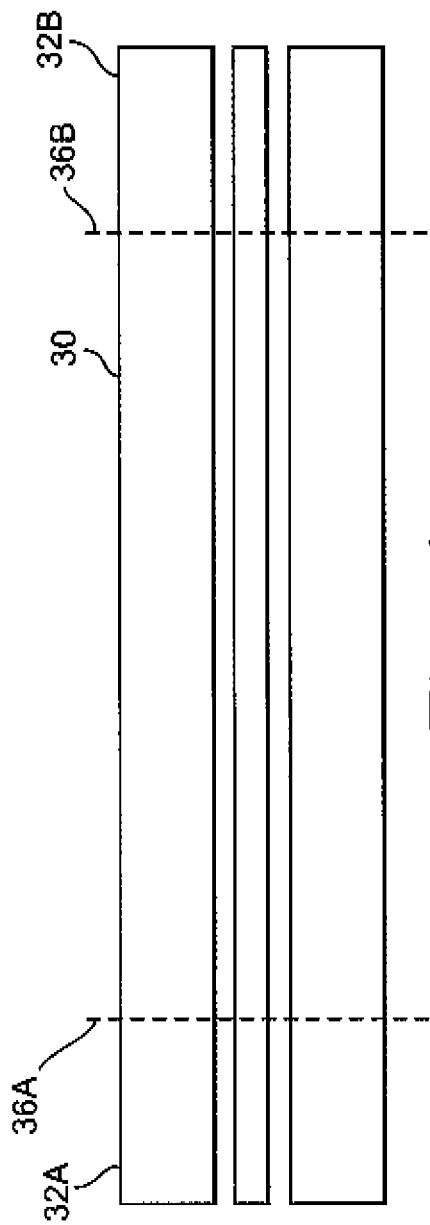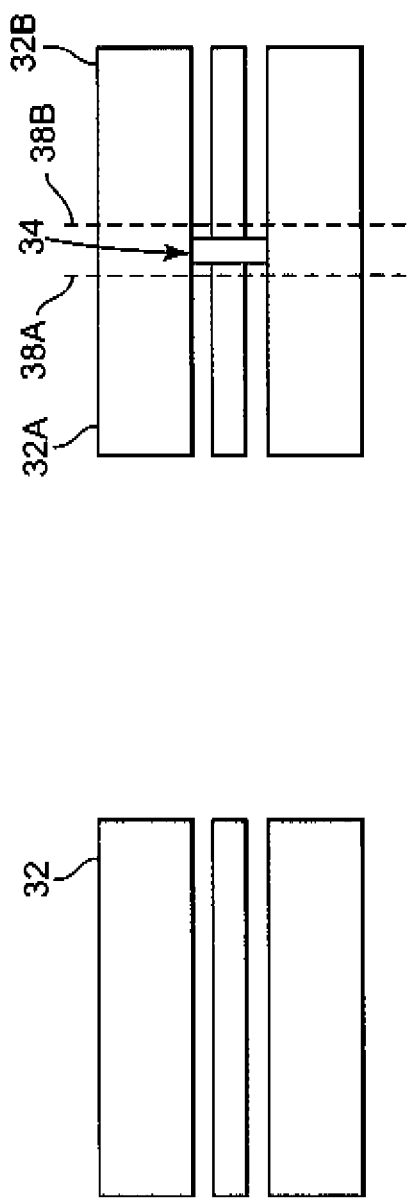

— TRL Cal   — LRRM Cal + Bisect De-embedding   — LRRM Cal, No De-embedding

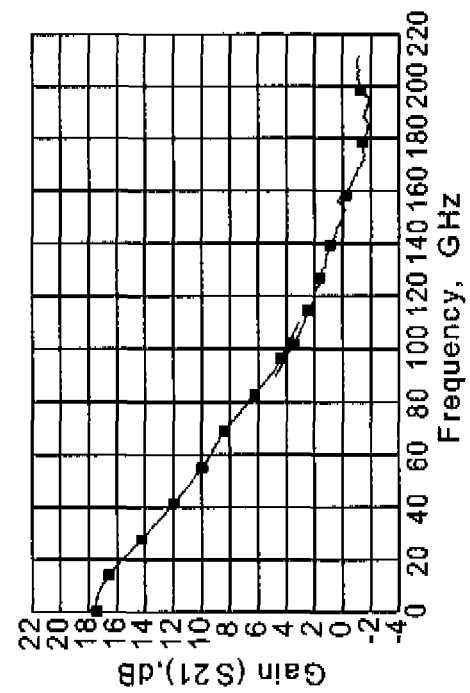
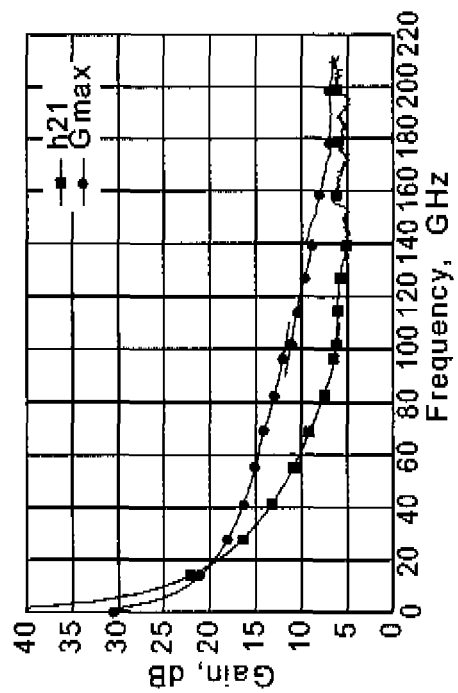
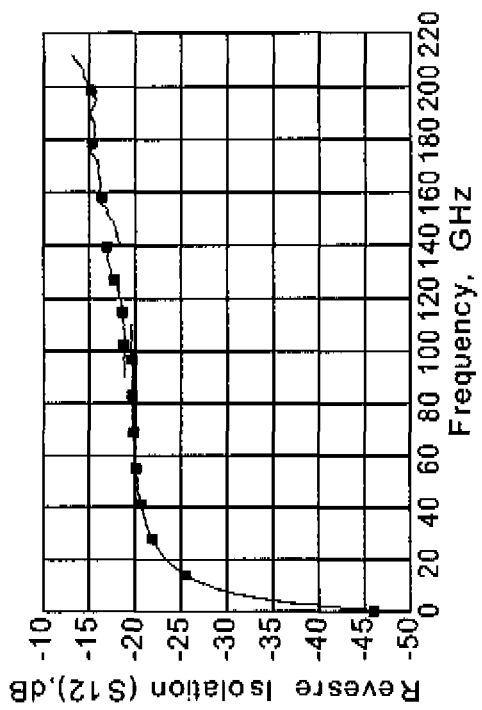
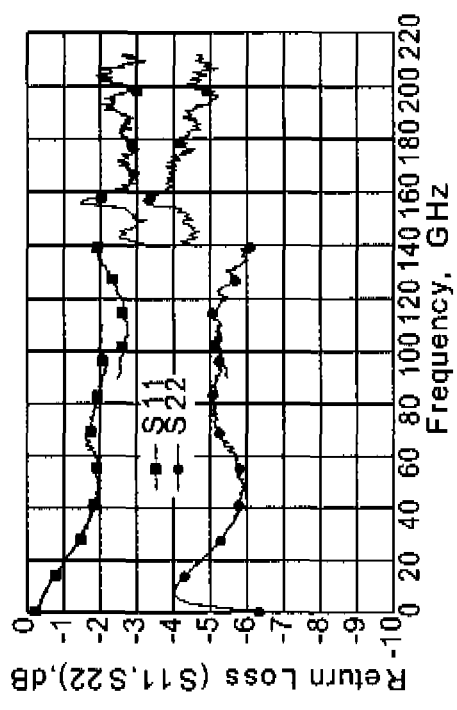
Fig. 11A
Fig. 11B
Fig. 11C
Fig. 11D

—— Y De-embedding
········ Bisect De-embedding

APPLICATION OF OPEN AND/OR SHORT STRUCTURES TO BISECT DE-EMBEDDING

RELATED PATENTS

This application claims the benefit of U.S. Provisional Application to Degerstrom et al., entitled, "APPLICATION OF OPEN AND/OR SHORT STRUCTURES TO BISECT DE-EMBEDDING," Ser. No. 61/352,159, filed Jun. 7, 2010, the content of which is incorporated herein by reference in its entirety.

BACKGROUND

The vector network analyzer (VNA) provides a framework for characterization of microwave properties of materials, semiconductor devices and circuits, transmission lines, and scores of other test subjects. Decades of research and development work have produced a wealth of calibration methods, used to remove the effects of cables, probes, and other portions of the measurement apparatus, leaving only the desired device under test (DUT) between the reference planes (the demarcation lines separating calibrated measurement apparatus from measurement subject). However, in many cases, it is not practical to arrange that the entirety of unwanted effects is removed using these calibration procedures. In these cases, calibration is often followed by de-embedding—a procedure which moves the calibration reference planes closer together, moving portions of what otherwise would be the DUT outside of the reference planes.

High frequency on-wafer measurements of single transistors, simple circuits, and transmission line structures are critical to characterization and development of advanced integrated circuit technologies. Although there exist many possible calibration and de-embedding methods, each has its drawbacks.

The most widely used techniques for transistor measurement involve open (Y) and/or short (Z) subtraction, which have been proven quite useful at lower frequencies, but which are limited in use at higher frequencies because, although the mathematics and matrix formulations are by nature distributed, the common Y and Z subtraction methods treat shunt and series components separately and hence amount to lumped element subtractions of capacitive and inductive parasitics. Although in principal, this lumped element limitation can be mitigated by reducing the dimensions of the probe pads and lead-in traces, as the measurement frequencies increase, decreasing the probe-probe spacing leads to excessive probe-probe coupling which can significantly negatively impact the measurements.

Other de-embedding techniques which do not suffer from the same lumped element constraints as the Y and Z subtraction techniques have been developed. However, these techniques generally require several precisely fabricated structures and/or they make assumptions regarding the network to be de-embedded which may be difficult to ensure. Therefore, implementation of these de-embedding techniques (e.g. for on-wafer measurement) can prove equally difficult to implement as calibration techniques which could supplant the de-embedding procedure (e.g. fabrication of on-wafer calibration structures), or which are limited to the same range of applicability as other methods (e.g. the lumped element approximation implicit in Y and Z subtraction methods).

SUMMARY

Application of open and short structures may result in improved accuracy in determination of ABCD parameters of a substantially symmetric THRU. Either one or both of the open and/or short techniques may be used to improve results of an ABCD optimization algorithm that determines the ABCD parameters of the substantially symmetric THRU. Bisect de-embedding may then be performed to determine the ABCD parameters of a device under test based on the ABCD parameters of the substantially symmetric THRU and measured s-parameters of the substantially symmetric THRU and the embedded device under test.

In one example, the disclosure is directed to a method comprising measuring a first set of s-parameters of a substantially symmetric THRU including first and second mirrored halves, measuring a second set of s-parameters of the first half of the substantially symmetric THRU having a short-circuited output, measuring a third set of s-parameters of the first half of the substantially symmetric THRU having an open-circuited output and determining ABCD parameters of the substantially symmetric THRU based on the first set of s-parameters and one or both of the second and third set of s-parameters.

The method may further include measuring a fourth set of s-parameters of the substantially symmetric THRU having an embedded device under test and determining ABCD parameters of the device under test based on the ABCD parameters of the substantially symmetric THRU and the fourth set of s-parameters.

The details of one or more examples are set forth in the accompanying drawings and the description below. Other examples will be apparent from the description and drawings, and from the claims.

BRIEF DESCRIPTION OF THE DRAWINGS

FIG. 2A shows S21 magnitude, FIG. 2B shows S21 phase, FIG. 2C shows S11 magnitude, and FIG. 2D shows S11 phase for a long transmission line.

FIG. 4 shows measured CPWG (grounded coplanar waveguide) transmission line structure and its computed bisected half.

FIGS. 6A-6C show block diagrams of an example transmission line structure (FIG. 6A), a THRU structure (FIG. 6B), and a measurement structure (FIG. 6C).

FIG. 7A shows measurements of S21 magnitude, FIG. 7B shows S21 phase, FIG. 7C shows S11 magnitude, and FIG. 7D shows S11 phase for a long transmission line.

FIGS. 11A-D show de-embedded S-parameters (FIGS. 11A-C) and h21 and Gmax (FIG. 11D) of an InP HEMT device measured over three separate frequency ranges.

FIG. 12A shows ft computed from h21, FIG. 12B shows fmax computed from Gmax (MSG/MAG), and FIG. 12C shows fmax computed from U (Mason's unilateral gain).

DETAILED DESCRIPTION

Bisect de-embedding techniques described herein include bisecting transmission characteristics of a substantially symmetric two-port network (referred to herein as a "THRU" structure) into first and second substantially mirrored halves. Bisect de-embedding utilizes transmission matrix mathematics to split a substantially symmetric THRU structure into mirrored halves which may then be mathematically removed from both ports of a two port measurement structure, leaving only the desired device under test ("DUT"). Bisect de-embedding offers the accuracy and high frequency utility of on-wafer calibration methods without the required fabrication and design precision or wafer real estate, and provides an alternative to de-embedding techniques limited by lumped element assumptions.

The bisect de-embedding techniques described herein include, for example, bisect de-embedding using a single substantially symmetric THRU structure, bisect de-embedding using a first half of a first substantially symmetric THRU structure and a second half of a second substantially symmetric THRU structure, and by combining bisect de-embedding with conventionally known de-embedding techniques.

Bisect de-embedding is described in U.S. Pat. No. 7,643,957 to Erik S. Daniel, issued Jan. 5, 2010, which is incorporated herein by reference in its entirety.

Application of open and short structures may result in improved accuracy in determination of ABCD parameters of a substantially symmetric THRU for purposes of bisect de-embedding. Either one or both of the open and/or short techniques may be used to improve results of an ABCD optimization algorithm. Bisect de-embedding may then be performed to determine the ABCD parameters of a device under test based on the ABCD parameters of the substantially symmetric THRU and measured s-parameters of the substantially symmetric THRU and the embedded device under test.

Figure 1A:
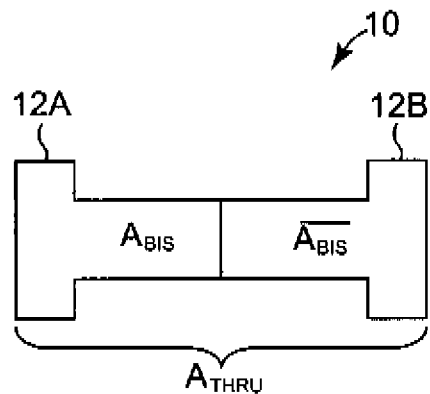
FIGS. 1A and 1B show a graphical representation of transmission matrix bisect de-embedding, showing a THRU structure (FIG. 1A) and a measurement structure containing an embedded device under test (FIG. 1B).
Figure 1B:
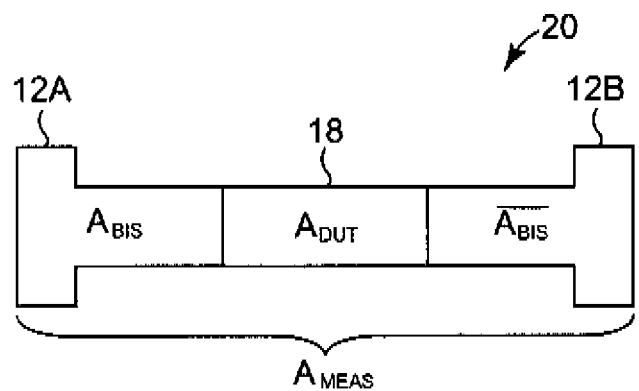

FIGS. 1A and 1B are block diagrams showing example structures that may be utilized for the bisect de-embedding techniques described herein. FIG. 1A shows a substantially symmetric THRU structure 10 having an associated transmission matrix $A_{THRU}$. THRU 10 includes two substantially symmetric mirrored halves 12A and 12B having associated transmission matrices $A_{BIS}$ and $\overline{A_{BIS}}$, respectively. FIG. 1B shows a measurement structure 20 including a device under test (DUT) 18 positioned between halves 12A and 12B of THRU 10. Measurement structure 20 has an associated transmission matrix $A_{MEAS}$. DUT 18 has an associated transmission matrix $A_{DUT}$. The techniques described herein utilize transmission matrix mathematics to split the substantially symmetric THRU structure 10 into substantially mirrored halves 12A and 12B which may then be mathematically removed from both ports of the two port measurement structure, leaving only DUT 18. In this way the ABCD or other transmission characteristics of the DUT 18 may be determined.

Bisect de-embedding utilizes transmission matrix mathematics to split a substantially symmetric THRU structure into mirrored halves which may then be mathematically removed from both ports of a two port measurement structure, leaving only the desired DUT 18. A two-port structure, such as THRU 10, may be represented as a 2×2 matrix S defined as follows:

$$S \equiv \begin{bmatrix} s_{11} & s_{12} \\ s_{21} & s_{22} \end{bmatrix}$$

The S-parameters $s_{11}$, $s_{12}$, $s_{21}$, and $s_{22}$, the reflection and transmission coefficients between incident and reflected waves, describe the behavior of a device under linear conditions at microwave frequency range. The S-parameters are defined as follows:

S11: input reflection coefficient of 50Ω terminated output.
S21: forward transmission coefficient of 50Ω terminated output.
S12: reverse transmission coefficient of 50Ω terminated input.
S22: output reflection coefficient of 50Ω terminated input.

S-parameters may be converted to other parameters such as hybrid (H), admittance (Y), or ABCD parameters. For example, an ABCD matrix A may be defined as follows:

$$A \equiv \begin{bmatrix} a & b \\ c & d \end{bmatrix}$$

Stability factor (K) and many gain parameters may also be computed from the s-parameters.

THRU 10 may be characterized by two unique complex numbers per frequency (as S11=S22 and S21=S12 for a symmetric THRU), whereas the bisected components in general may be characterized by three complex numbers per frequency (S21=S12 assuming the structure is reciprocal, but in general S11 does not equal S22). The present disclosure recognizes that measured S-parameters on a THRU structure may not be exactly symmetric (due to both measurement error and nonidealities in the physical structure) and in fact it shall be understood that the disclosure does not require that THRU 10 be exactly symmetric. The problem mathematically becomes overdetermined rather than underdetermined, and that there may be additional constraints on reasonable THRU structures, constraining (among other things) behavior of the S-parameters over frequency. This will be explained further below.

In the example described with respect to FIGS. 1A and 1B, S-parameters may be converted to ABCD matrix format for performing the required network computations, though cascade matrices or other transmission matrix representations would be equally applicable, and the disclosure is not limited in this respect. In order to bisect THRU 10 into mirror image halves 12A and 12B, for example, one desires to solve the following ABCD matrix equation:

$$A_{BIS} \cdot \overline{A_{BIS}} = A_{THRU} \quad (1)$$

where the overbar indicates symmetric conjugation defined as follows:

$$\overline{\begin{bmatrix} a & b \\ c & d \end{bmatrix}} \equiv \frac{1}{ad-bc} \begin{bmatrix} d & b \\ c & a \end{bmatrix} \quad (2)$$

Physically, the symmetric conjugate of an ABCD matrix describes the same physical structure as the original ABCD matrix but with the two ports reversed.

To bisect a substantially symmetric THRU structure into first and second substantially mirrored halves, the bisect de-embedding techniques utilize an iterative optimization technique and constraints on the solution over frequency to split a substantially symmetric two-port network into solutions of substantially mirrored halves. As mentioned above, Equation 1 for $A_{BIS}$ generally has no solution unless $A_{THRU}$ is exactly symmetric (i.e., equal to its own symmetric conjugate). In practice, measurement error and slight asymmetries in a physical THRU structure may therefore cause there to be no exact solution to this equation. It may therefore be solved approximately. In one example, a Levenberg-Marquardt optimization of the complex components a, b, c, and d at each frequency point may be performed, subject to the constraints defined in the above equation for $A_{BIS}$. An example implementation of a Levenberg-Marquardt optimization may be found in W. H. Press, A. A. Teukolsky, W. T. Vetterling, and B. P. Flannery, *Numerical Recipes in C*, Second Edition ed: Cambridge University Press, 1992, pp. 683-688, which is incorporated herein by reference in its entirety. The Levenberg-Marquardt (LM) algorithm is an iterative technique that finds a local minimum of a function that is expressed as the sum of squares of nonlinear functions. Although a specific example using a LM optimization is described herein, it shall be understood that other optimization implementations may also be used, and that the disclosure is not limited in this respect.

In order to properly constrain the solution, an additional equation is needed: ad−bc=1. This is equivalent to the S21=S12 reciprocity restriction for the bisected half of the THRU (a correct assumption for passive non-magnetic THRU structures). Convergence to the appropriate solution is encouraged through utilization of lower frequency solutions as initial starting solutions for subsequent frequency solutions.

An initial guess or "seed" of the solution variables at each frequency point is made. In some examples, as the characteristics of the typical THRU structure vary relatively slowly with typical measured frequency steps, the initial guess for each frequency may be taken to be the solution at the previous frequency. Also, in some examples, the initial guess for the first frequency may be taken to be the unit matrix, representing lossless transmission with zero phase delay. If the first frequency is larger than the self-resonant frequency of the THRU, a first initial guess with a rough estimate of the phase delay may place the solution in the correct phase quadrant.

Once $A_{BIS}$ (the transmission matrix for the first half 12A of THRU 10) has been obtained, $A_{DUT}$ (the transmission matrix for the device under test) may be computed as follows:

$$A_{DUT} = A_{BIS}^{-1} \cdot A_{MEAS} \cdot (\overline{A})^{-1} \quad (3)$$

In some examples, THRU 10 is substantially symmetric. That is, it shall be understood that THRU 10 need not be exactly symmetric. Symmetry is not a rigid requirement (for example, as is mentioned above, measured data may not be exactly symmetric), and the method may be robust even in the presence of designed-in asymmetries, as will be further described below. In some examples, THRU 10 may also be substantially transmissive (i.e., not highly reflective). It is not required that the THRU be a transmission line of known impedance or have any other specific known characteristic.

Validation of bisect de-embedding will now be described through application to bisection of a simulated THRU structure and to bisection of a measured THRU.

Figure 2A:
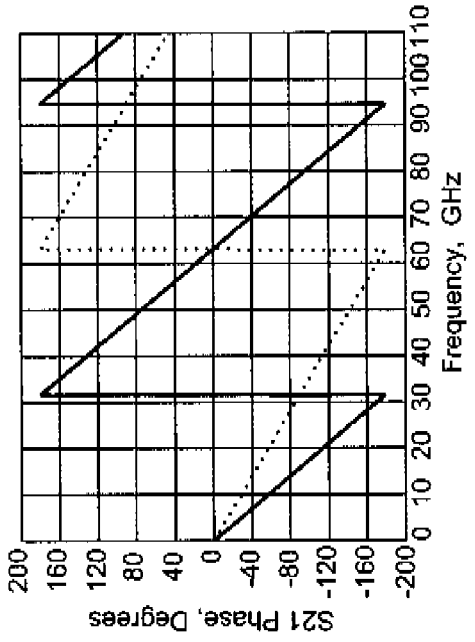
FIGS. 2A-2D show a simulated lossy transmission line structure and its computed bisected half.
Figure 2B:
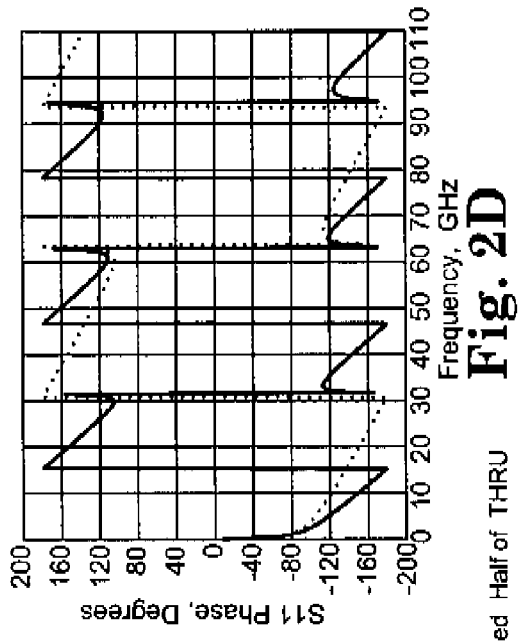
Figure 2C:
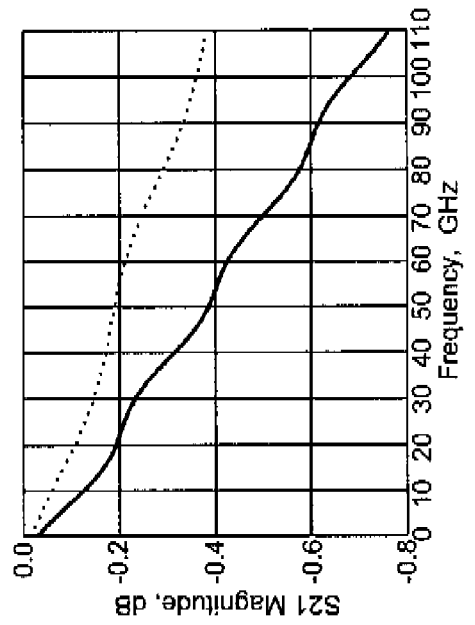
Figure 2D:
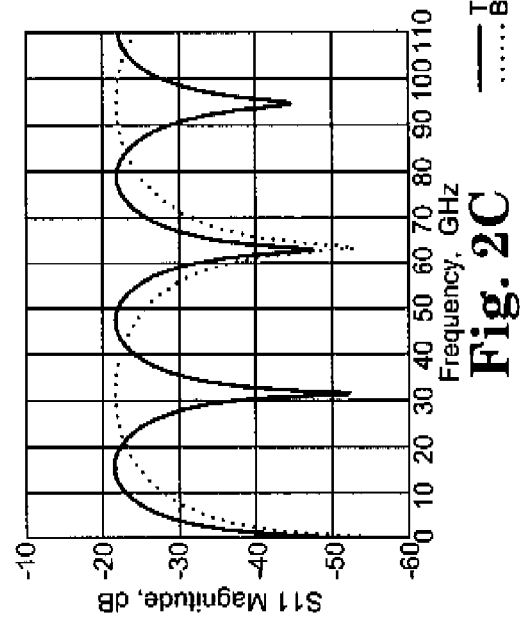

In order to test application of the bisection algorithm to a perfectly symmetric virtually noiseless set of data, S-parameters of a lossy transmission line of approximately 46 Ohm impedance (in high frequency limit) and 16 ps electrical length were generated over a frequency range from DC to 100 GHz. Both dielectric losses and skin effect losses were included. S-parameters for a bisected half of the transmission line were computed by converting the S-parameters to ABCD parameters, executing the algorithm described above, followed by conversion back to S-parameters (assuming 50 Ohm port impedance). The insertion loss and return loss corresponding to port 1 stimulus (S21 and S11) are plotted in FIGS. 2A-2D in both magnitude and phase for both the original THRU line and the bisected half. FIG. 2A shows S21 magnitude, FIG. 2B shows S21 phase, FIG. 2C shows S11 magnitude, and FIG. 2D shows S11 phase.

As mentioned above, in the event that the THRU S-parameters are exactly symmetric (as is the case here to within numerical precision), the solution to equation (1) is not uniquely determined, yet inspection of FIGS. 2A-2D indicates that the solution provided by the algorithm is useful. The insertion loss of the bisected half is half that of the original THRU (both in magnitude and phase). Similar observations can be made regarding the return loss. The THRU length and frequency span were chosen such that the data span significantly more than 360 degrees of phase of the THRU, demonstrating that the algorithm converges to the correct solution over wide ranges of phase and is not limited to ranges of frequency or delay dictated by the THRU structure parameters. Also, note that the impedance of the THRU (while spatially uniform in this example) was arbitrarily chosen and deviates from, for example, the 50 Ohm port impedance.

Figure 3:
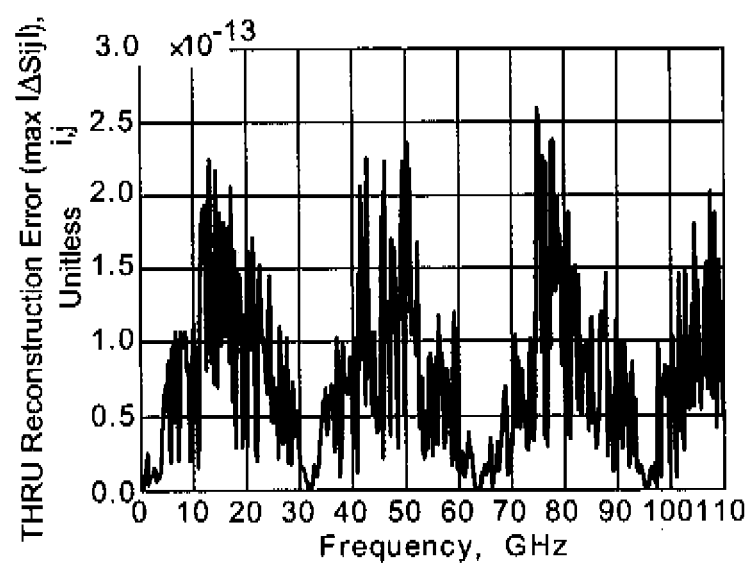
FIG. 3 shows magnitude of maximum error in S-parameters of reconstructed THRU relative to original simulated lossy transmission line THRU.
Figure 4A:
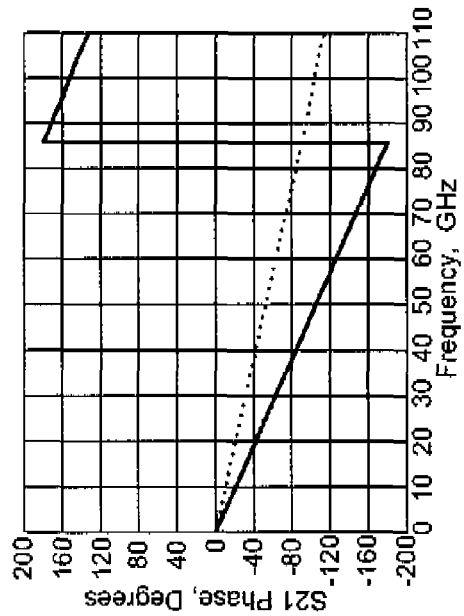
FIG. 4A shows S21 magnitude.
Figure 4B:
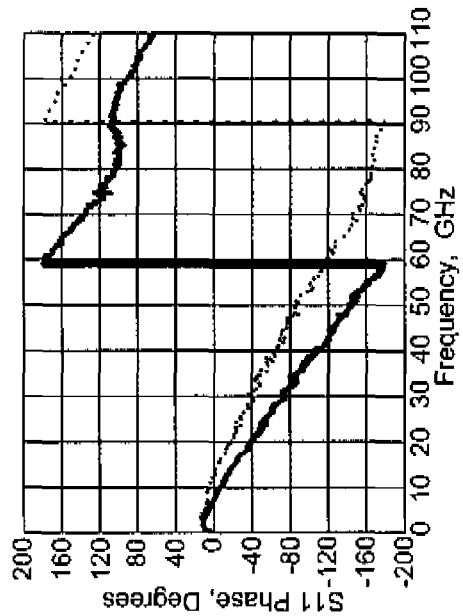
FIG. 4B shows S21 phase.
Figure 4C:
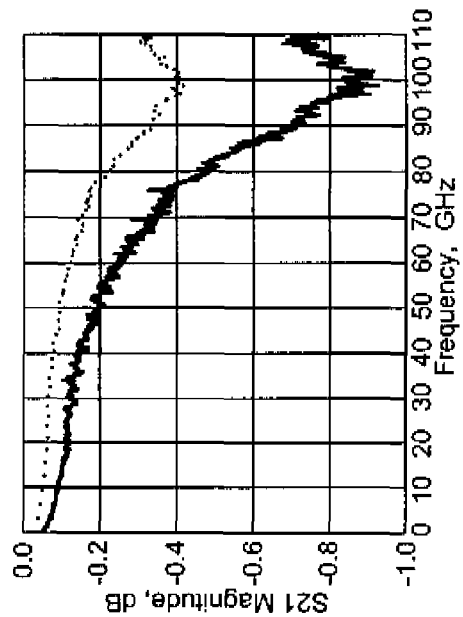
FIG. 4C shows S11 magnitude.
Figure 4D:
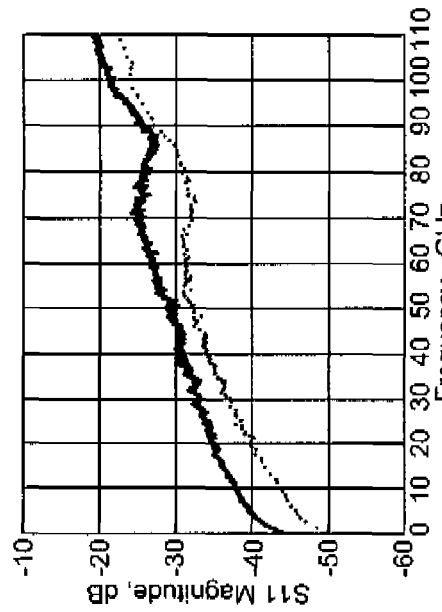
FIG. 4D shows S11 phase for a transmission line longer than that used in the THRU.

In order to verify that the bisected half of the THRU does in fact represent a solution of equation (1), the bisected half may be chained with its symmetric conjugate and then compared with the original THRU. FIG. 3 contains a plot of the maximum amplitude of the difference of each of the four separate S-parameters over the range of frequency considered. In equation form, the following error quantity is plotted:

$$\max_{i,j} |\Delta S_{ij}| \quad (4)$$

where $$\Delta S_{ij} = S_{ij}^{Original} - S_{ij}^{Reconstruct} \quad (5)$$

with $S^{original}$ representing the S-parameters of the original THRU and $S^{reconstruct}$ representing S-parameters of the THRU reconstructed from the chain of the bisected half with its conjugate.

As can be seen in FIG. 3 from the very small magnitude of the error residuals (~$10^{-13}$), the bisected half does very closely represent a solution of equation (1) and in fact is limited primarily by the specific choice of parameters defining convergence criteria for the solution iterations.

Validation of bisect de-embedding as it applies to measured data which is not precisely symmetric and hence supports no exact solution of (1) is now described. For this purpose, measurements were performed on a grounded coplanar waveguide (CPWG) THRU of roughly 16 ps electrical length, fabricated in an InP HEMT integrated circuit process. The test structures are described in more detail elsewhere. These measurements were carried out on an Agilent HP8510XF VNA. An off-wafer LRRM calibration (using a GGB Industries CS-5 impedance standard substrate) was performed using Cascade Microtech Wincal™ software.

As above, magnitude and phase of insertion loss and return loss measured with port 1 stimulus are shown in FIGS. 4A-4D for both the measured THRU and the computed bisected half. As before, the insertion loss magnitude and phase of the bisected half is half that of the original THRU and the computed bisected half. As before, the insertion loss magnitude and phase of the bisected half is half that of the original THRU. The return loss cannot be analyzed simply with factors of two for several reasons. First, as will be discussed shortly, the measured THRU is not exactly symmetric. Second, it is not expected that the bisected half should necessarily be symmetric in this case, as the probe-to-CPWG transition only occurs at the THRU endpoints. In fact S11 and S22 of the bisected half do differ slightly, but only S11 is presented in the interest of brevity. Finally, note that the THRU transmission line return loss is quite small in magnitude and hence more sensitive to measurement error. Nonetheless, the bisected data represents the expected bisection solution with respect to insertion loss and a reasonable solution with respect to return loss.

Figure 5A:
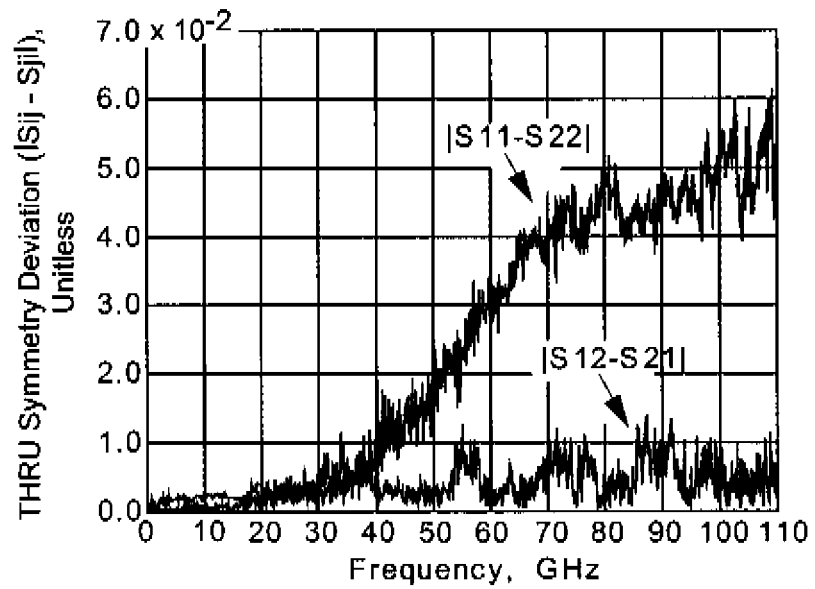
FIG. 5A shows the magnitude of deviations of THRU S-parameters from symmetry.
Figure 5B:
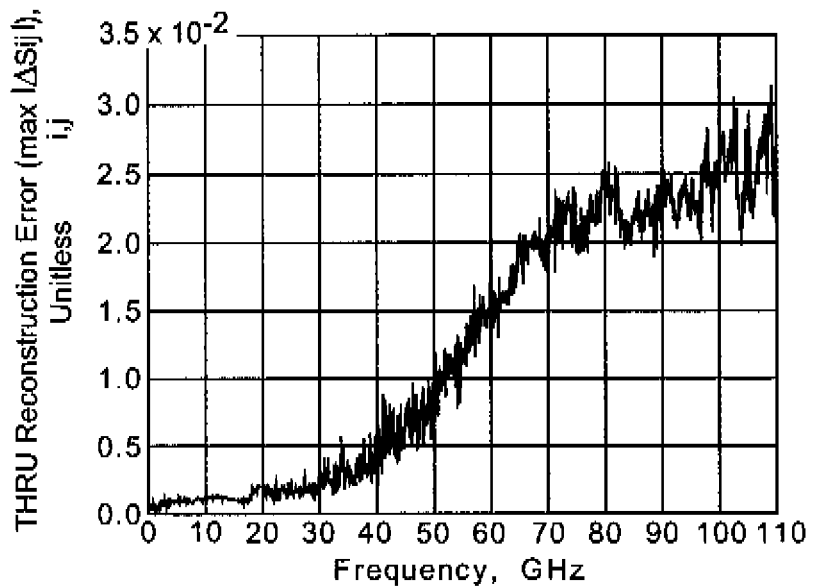
FIG. 5B shows the magnitude of maximum error in S-parameters of reconstructed THRU relative to original measured CPWG THRU.

As with the numerical THRU data, in order to verify that the bisected THRU represents a solution of equation (1), we examine the error in the reconstructed THRU. However, first, in FIG. 5A we plot the deviation from symmetry in the S-parameters in order to determine the expected magnitude of deviation from ideal THRU reconstruction given that an exact solution of equation (1) is not possible. As can be seen in FIG. 5A, deviations from symmetry are on the order of $10^{-2}$. Even in the presence of asymmetry, the THRU structure should be reciprocal, hence deviations in S12-S21 represent measurement or calibration errors. Although this THRU was designed to be exactly symmetric, deviations in S11-S22 (which are somewhat larger) may also include slight asymmetries in the measurement structure (or perhaps the probing environment). Given these deviations from symmetry, we can expect the error plotted in FIG. 5B to have a lower bound of one half of the maximum of the two errors plotted in FIG. 5A, as the minimum error solution would be given by the symmetrized form $$S^{sym} = \frac{1}{2}\begin{pmatrix} S_{11}+S_{22} & S_{21}+S_{12} \\ S_{21}+S_{12} & S_{11}+S_{22} \end{pmatrix} \quad (6)$$

which deviates from both the original THRU S-parameter matrix and its symmetric conjugate by half of the difference between the two. FIG. 5B has been plotted on a vertical scale of half that of FIG. 5A to illustrate that the reconstruction error is minimized.

In some cases, the algorithm may converge to undesired solutions. For example, one could not expect the algorithm to converge to a useful bisected solution for an open structure with little transmission between the ports (e.g. a capacitance between port 1 and 2), as the starting solution for the lowest frequency iterations (by default) is assumed to be a unity transmission matrix. More generally, if the reflection of the THRU is particularly poor, the algorithm may converge to an unwanted solution. This behavior has been observed when bisect de-embedding has been applied to simulated THRU structures deviating significantly from the ideal (e.g. with very low transmission and significant return loss). No such behavior has been observed when applied to measured THRU data, though all THRU structures to which the method has been applied to date were characterized with reasonable return loss (better than −5 dB). This behavior may be related to the difference between solution of an undetermined system in the case of exactly symmetric data versus an overdetermined system in the case of (nonideal) measured data, but his has not been further investigated at present. The algorithm can converge to an incorrect phase if the lowest frequency considered is not within the initial 180 degrees of phase of the bisected THRU structure (e.g. for measured data which does not begin near DC). This can be rectified simply by adjusting the phase of the initial starting solution.

Validation of bisect de-embedding through application to measurement of a range of test structures and comparison to alternative methods will now be described. For all examples presented here, the algorithm described above was implemented through a series of Perl scripts and compiled C language routines. Average runtimes for the de-embedding computations on measured data files with 400-800 data points were on the order of 10-20 seconds on a modern Unix workstation.

In order to evaluate the efficacy of the bisect de-embedding method, it is desirable to make as direct a comparison as possible to another better known method. On-wafer TRL calibration structures provide for an excellent comparison mechanism, as the THRU used for the TRL calibration can also be used as the THRU for the bisect de-embedding procedure, moving an off-wafer calibration reference plane to the same position defined by the on-wafer TRL calibration. The primary difficulties in carrying out this comparison are that well-characterized on-wafer TRL calibration structures are required, and that differences between the on-wafer calibration and the off-wafer calibration plus de-embedding can be brought about either by imperfections in the de-embedding method or by differences in the details of the two calibrations (e.g., differences in the effective port impedance resulting from the two calibrations). This will be discussed further below with respect to the specific measured data.

FIGS. 6A-6C are representative diagrams of example test structures used for this purpose. The structures are based on grounded coplanar waveguide (CPWG). FIG. 6A shows a diagrams of an example measurement structure having a T-line 30 (~10 ps electrical length) used for the 5-40 GHz range of TRL calibration, FIG. 6B shows a diagram of an example THRU 32 used for both the TRL calibration and the bisect de-embedding, and FIG. 6C shows a diagram of an example sample structure 34 (a HEMT device in the examples described herein) embedded within THRU 32. Also used for the TRL calibration (not shown) are a shorter T-line (~1.5 ps electrical length) used for the 40-110 GHz frequency range and SHORT reflect standards. The on-wafer TRL calibration reference planes 36A and 36B (the same as the reference planes after off-wafer calibration plus bisect de-embedding) are indicated in FIG. 6A, as well as first and second mirrored halves of THRU structure 32A and 32B, respectively. Reference planes 38A and 38B for bisect de-embedding are indicated in FIG. 6C, as well as first and second mirrored halves of THRU structure 32A and 32B, respectively.

FIGS. 7A-7D illustrate S-parameter data measured on the long transmission line shown in FIG. 6A using two different methods: 1) On-wafer TRL calibration, and 2) off-wafer LRRM calibration (using a GGB Industries CS-5 impedance standard substrate) plus bisect de-embedding. The measurement with the off-wafer calibration is also shown before de-embedding. Both calibrations utilized Cascade Microtech Wincal™ software, and measurements were carried out with an HP8510XF VNA.

Figure 7A:
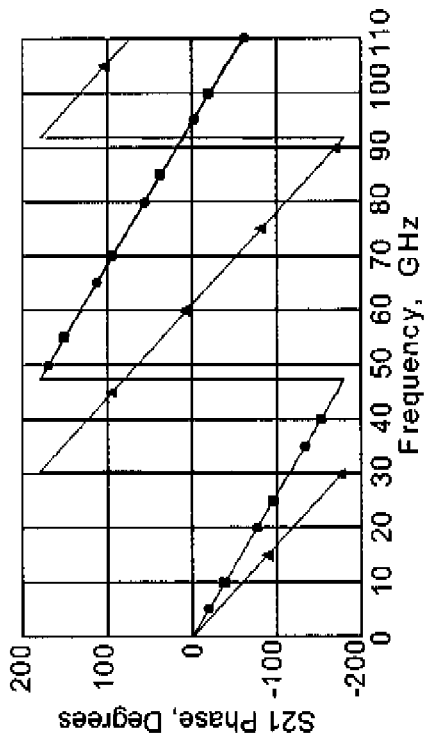
FIGS. 7A-7D show a comparison of on-wafer calibration to off-wafer calibration plus bisect de-embedding.
Figure 7B:
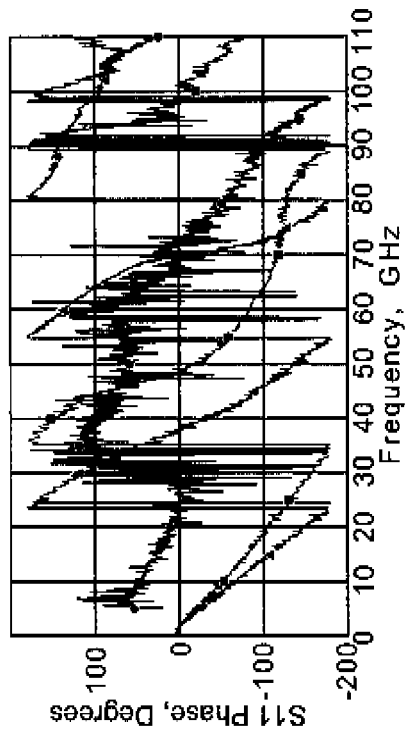
Figure 7C:
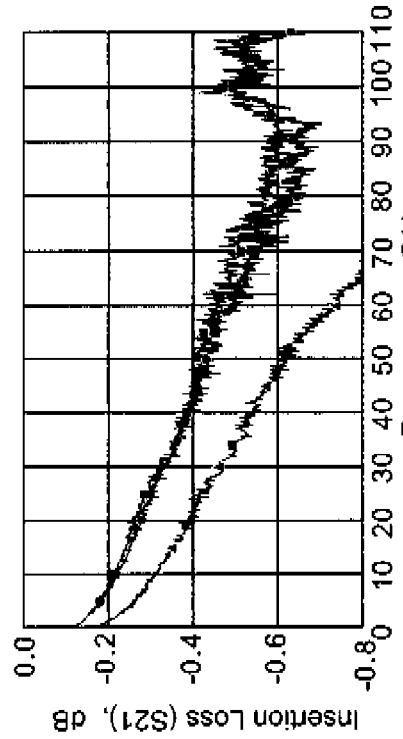
Figure 7D:
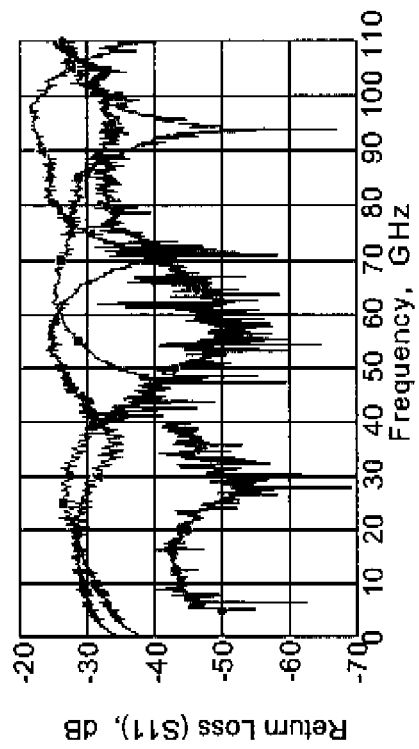
Figure 8A:
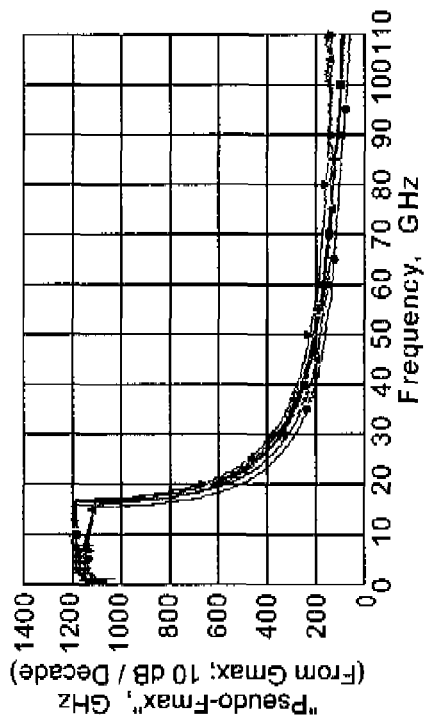
FIGS. 8A-8D show comparisons of various de-embedding methods applied to ft and fmax characterization of a SiGe HBT.
Figure 8B:
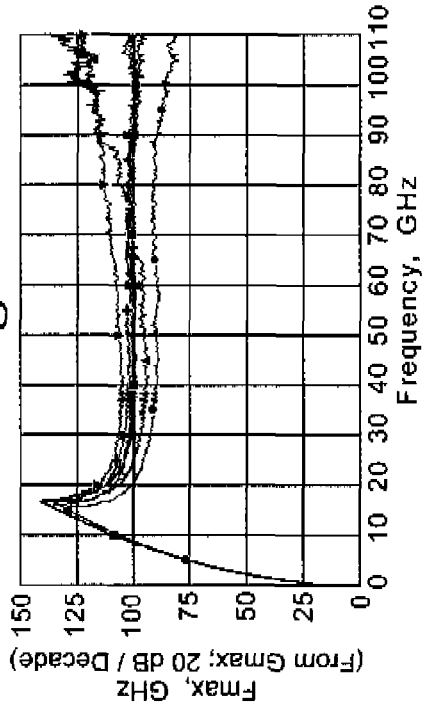
Figure 8C:
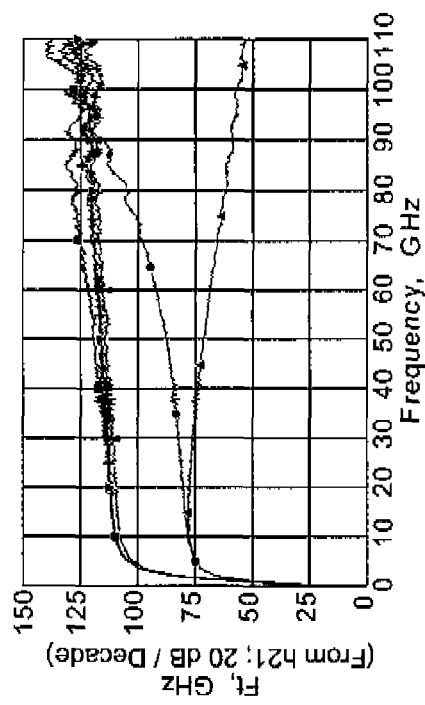
Figure 8D:
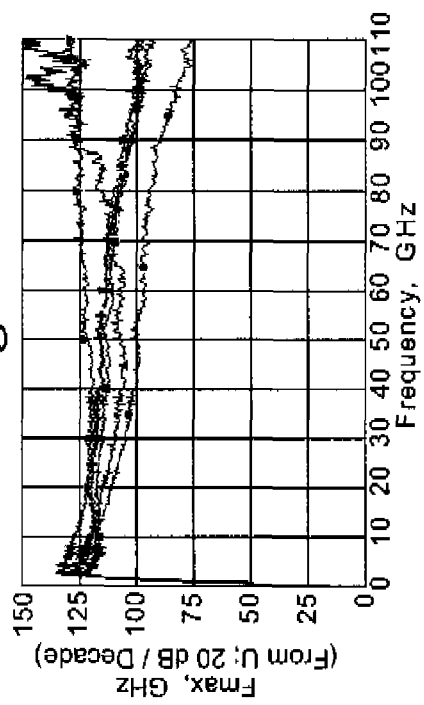
Figure 9A:
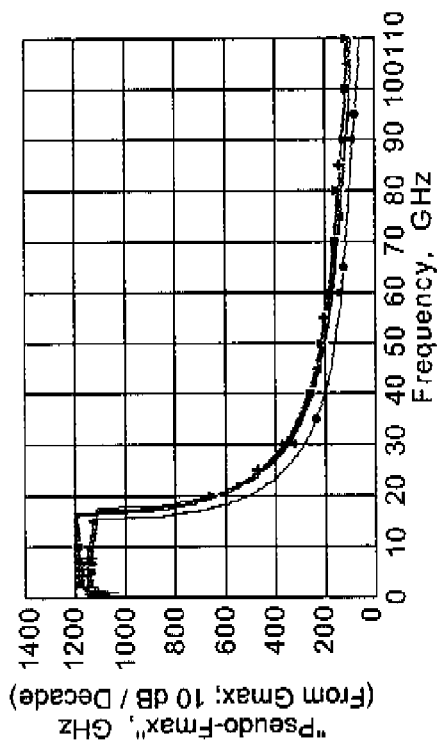
FIGS. 9A-9D show comparisons of various de-embedding methods used in conjunction with bisect de-embedding, applied to ft and fmax characterization of a SiGe HBT.
Figure 9B:
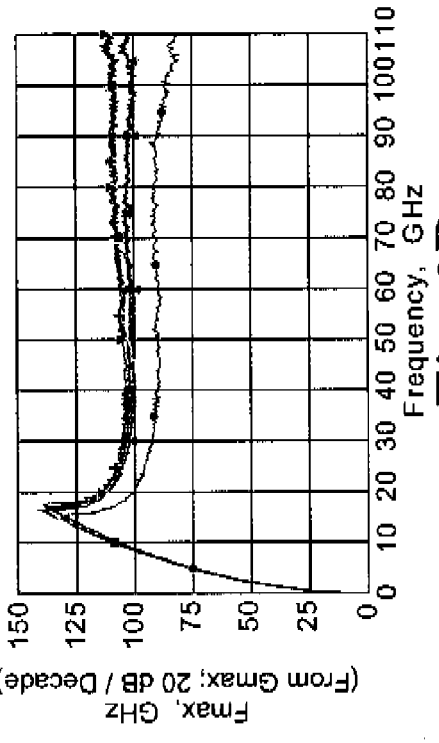
Figure 9C:
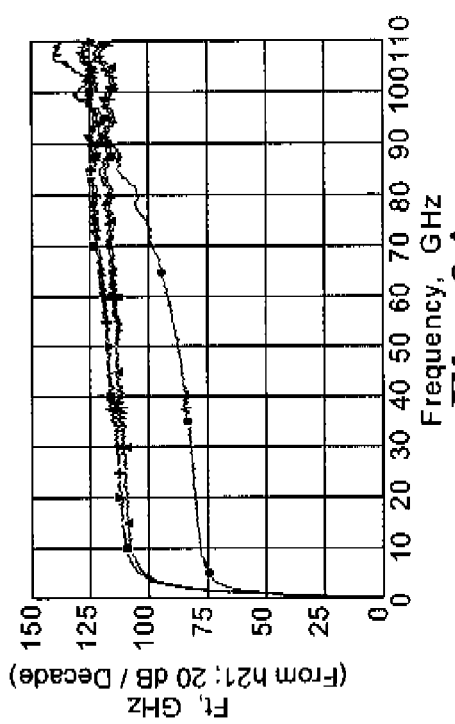
Figure 9D:
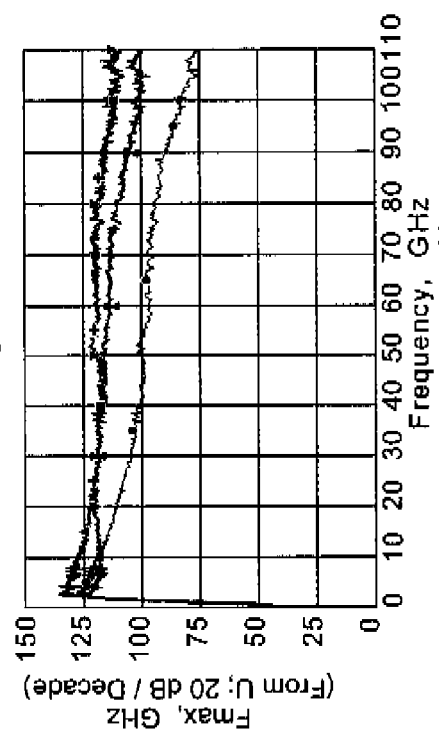
Figure 10A:
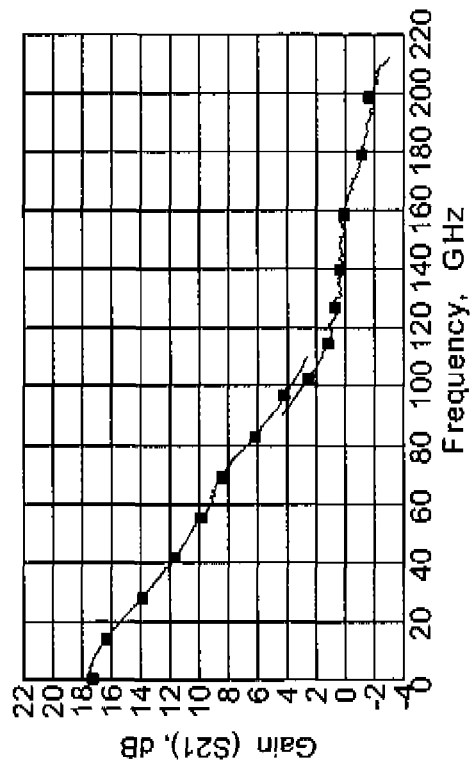
FIGS. 10A-D show raw (not de-embedded) S-parameters (FIGS. 10A-10C) and h21 and Gmax (FIG. 10D) of an InP HEMT device measured over three separate frequency ranges.
Figure 10B:
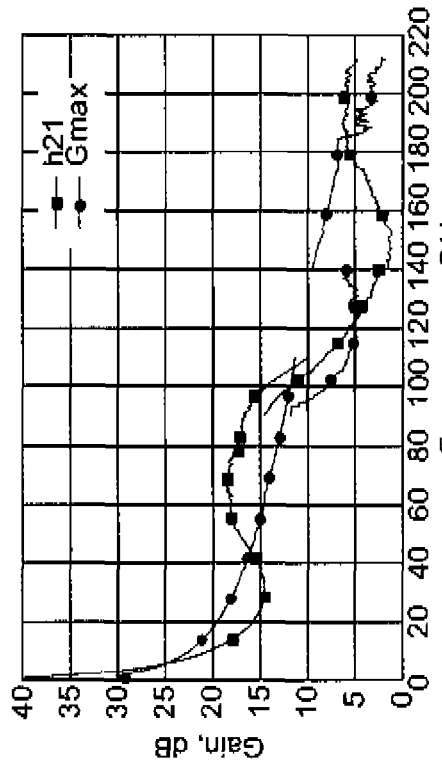
Figure 10C:
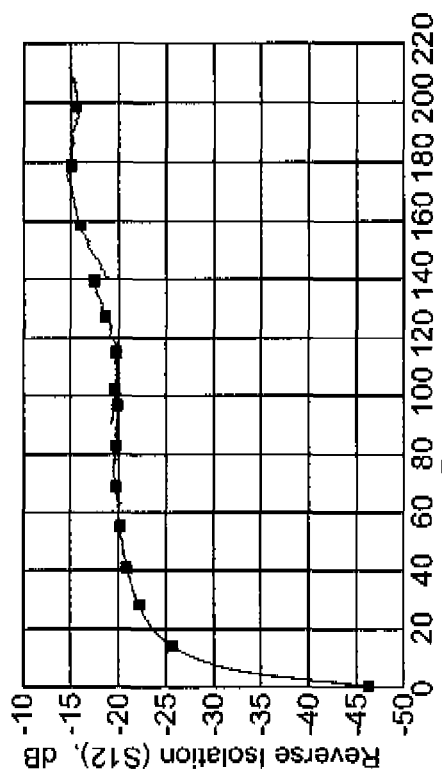
Figure 10D:
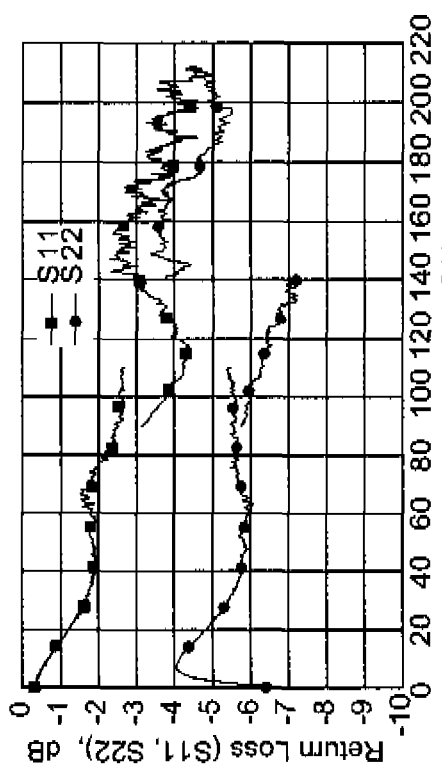

FIGS. 7A and 7B illustrate correlation of less than 0.1 dB magnitude and less than 1 degree phase difference over the entire frequency range in the transmission characteristics measured using the two methods. It is possible that these small differences are a result of the fact that the measurements were acquired on different days with the probes repositioned (e.g., a 1 degree phase difference at 110 GHz corresponds to roughly 3 microns length difference). There is somewhat more difference between the measured reflection values shown in FIGS. 7C and 7D (though this is in large part because the data is plotted in dB rather than unitless magnitude). These differences may be largely due to the differences between the effective port impedance resulting from the different calibrations, as the port impedance is set by transmission line structures for the TRL calibration, but by a resistive load for the LRRM calibration. A transmission line nominally identical to the DUT (from a different wafer reticle) was used for the 5-40 GHz portion of the on-wafer TRL calibration. The return loss in the TRL measurement is significantly lower than that for the LRRM+de-embedding measurement.

Close inspection indicates some nonidealities in the data measured using the TRL calibration (e.g., slight discontinuity in phase at the 40 GHz breakpoint between THRU, a periodicity in the return loss structure, etc.), whereas the LRRM+ de-embedding data seem to have S11 characteristics more closely resembling the ideal. Given that imperfections in the TRL line structures were found to be evident (e.g. the mild resonance at ~95 GHz), evidence of TRL calibration imperfections is not surprising. In other words, the apparent differences are not related to the de-embedding method. We note that analysis of other measured structures (opens, shorts, and transistor structures) on the same wafer using the same two methods resulted in similar comparisons.

Of particular interest to the device physics and engineering community is the use of de-embedding in determining transistor figures of merit (e.g. ft and fmax) and in extracting S-parameters used for model extraction. Through appropriate design of a set of single device test structures and accompanying de-embedding structures, it is possible to compare bisect de-embedding to a set of other de-embedding methods, keeping the calibration the same (off-wafer LRRM as described above). The test structures used for LRRM calibration are similar to those shown in FIGS. 6A-6C described above. Additional structures replacing the transistor with shorting metal in one case and with metal removed in a second case allowed the use of Z and Y de-embedding techniques as well.

For the comparisons shown in FIGS. 8A-8D and FIGS. 9A-9D, the device under test is a transistor (SiGe HBT fabricated in IBM 7HP technology), and rather than comparing raw S-parameters, we compare ft and fmax values, as these represent the typical metrics of common interest in such measurements of high performance transistors, and are sensitive to magnitude and phase of all of the S-parameters.

At each measured frequency, three gain values are computed from the measured S-parameters: h21 (small signal current gain), Gmax (maximum stable gain [MSG]/maximum available gain [MAG]), and U (Mason's unilateral gain). Ideally, simple transistor models predict that each of these gain parameters rolls off with a 20 dB/decade slope (except for Gmax which rolls off at roughly 10 dB in the MSG region and 20 dB in the MAG region), but in reality, deviation from this ideal slope is possible due to higher order effects. For example, the ft is computed at each measured frequency by extrapolating the h21 gain at that frequency to unity gain using an assumed 20 dB/decade slope, so if the h21 truly were dropping at 20 dB/decade, the ft plot would be flat over frequency. Similarly, fmax may be computed from U or Gmax in the same fashion. A "Pseudo-fmax" is also shown, extrapolating Gmax at 10 dB/decade, strictly for inspection of the MSG (low frequency) region of Gmax. This method of representing the ft and fmax values brings out much more subtlety than the more traditional method of plotting h21, U, and Gmax on a log frequency scale. This allows the differences between the various methods to be discerned.

In FIGS. 8A-8D, in addition to the bisect de-embedding technique described herein, several different de-embedding methods are compared, applied to the same single HBT measurement: Y (open) subtraction, Z (short) subtraction, as well as combinations of these (Y first, then Z, and Z first, then Y). The raw (non-de-embedded) data is also shown for comparison. Precisely identical results are not expected in this case from one de-embedding method to the next, as the open and short de-embedding structures contain small amounts of additional on-wafer metal trace not present in the THRU structure.

Nonetheless, nearly all de-embedded measurements are similar (with the exception of Z-subtraction alone which is rarely used) as the differences between the de-embedded physical features are small, and the bisect method very closely matches the (commonly used) Y+Z method.

If the lumped element assumption implicit in the Y and Z methods were valid, the Y+Z and Z+Y methods would yield the same results, yet in FIGS. 8A-8D these two methods diverge somewhat at frequencies above 30-40 GHz, suggesting that the lumped element approximation is not strictly valid above these frequencies. In FIGS. 9A-9D, Y and Z de-embedding methods can be used in conjunction with the bisect de-embedding method to remove the small amount of additional trace parasitic remaining after the bisect method has already been applied. Here, the Y+Z and Z+Y methods do result in nearly identical results, as the lumped element approximation applied to the small remaining parasitic elements is valid. Further, the predominant parasitic contribution is capacitive, as all methods utilizing Y subtraction are clustered, while those not utilizing Y are also clustered (not including the data without any de-embedding which is also shown for reference).

Data acquired on a high frequency InP HEMT (fabricated in the same process described above) using three separate instruments will now be described. As above, measurements to 110 GHz were carried out with an HP8510XF. Two sets of extender heads from Oleson Microwave Labs combined with a lower frequency HP8510C and GGB Industries waveguide probes cover F-band (90-140 GHz) and G-band (140-220 GHz).

In this case, as the on-wafer calibration structures were found to be insufficient for calibrations above 110 GHz, and as the electrical length of the THRU is sufficiently long that Y and Z subtraction techniques are not appropriate, the only reasonable method available to us for computing the de-embedded S-parameters was the bisect de-embedding method described herein. For each of the three frequency bands, an LRRM calibration was performed as described above, but with a GGB CS-15 ISS instead of the CS-5 mentioned above, as the finer CPW geometries on this ISS support measurements to 220 GHz. For logistical reasons, at the time these measurements were performed, it was only possible to acquire data to 212 GHz instead of the full 220 GHz supported by the system, but we do not know of any reason why in principle the same methodologies could not be applied to the last 8 GHz of the range supported by the instrumentation.

The measured data before de-embedding and after de-embedding is shown in FIGS. 10A-10D and FIGS. 11A-11D respectively. S-parameter magnitudes (FIGS. 10A-10C and 11A-11C) as well as h21 and Gmax (FIGS. 10D and 11D) are shown. Relatively small discontinuities are observed at the endpoints of each of the three measurement ranges in both sets of plots, indicating that the calibrations of each of the VNA instruments differ slightly. To some degree, after de-embedding, these discontinuities are improved as, select systematic nonidealities, which apply equally to the measurement of the de-embedding THRU and the DUT (e.g. probe contact resistance), are removed as part of the de-embedding procedure. Improved calibration in the waveguide bands may reduce the magnitude of these discontinuities.

There is relatively little difference between the raw and de-embedded S-parameter magnitudes as, even at 220 GHz, the THRU structure presents a relatively small loss, but the phase differences are larger, as is evidenced by the difference in raw and de-embedded h21 which is sensitive to phase. In principle, the Gmax is insensitive to reactive parasitics and hence should depend little on de-embedding, unless the de-embedding causes the stability factor (K) to cross unity, causing the Gmax to switch from the MSG to MAG region (or vice versa), as is observed in the majority of the 90-140 GHz range.

De-embedding is an important part of single transistor characterization, as the probe pads and interconnects used to contact the single transistors are often large compared with the bare transistors and hence can significantly modify the measured S-parameters used to compute transistor figures of merit (e.g. ft and fmax) and used for model extraction and subsequent circuit design. Many de-embedding methods have been developed and used successfully for this purpose. One of the most widely used is the simple Y subtraction method, in which measured S-parameter measurements on the transistor structure. Here we compare measurements of InP HBT structures (fabricated by Vitesse Semiconductor in a process under development) de-embedded both using a simply Y subtraction method and the bisect de-embedding method described herein.

Figure 12A:
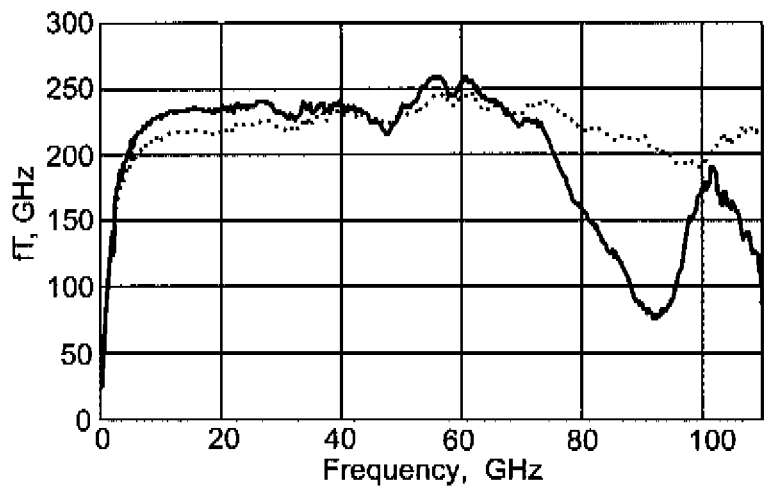
FIGS. 12A-12C show transistor figures of merit derived from measured S-parameters of an InP HBT de-embedded using two different methods.
Figure 12B:
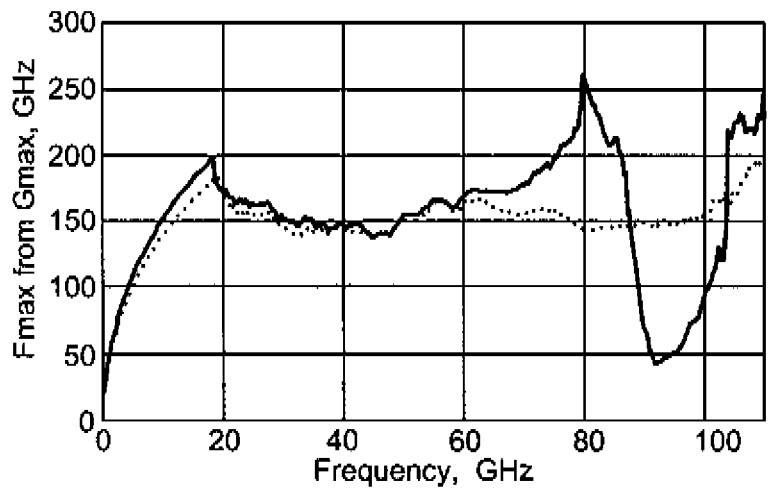
Figure 12C:
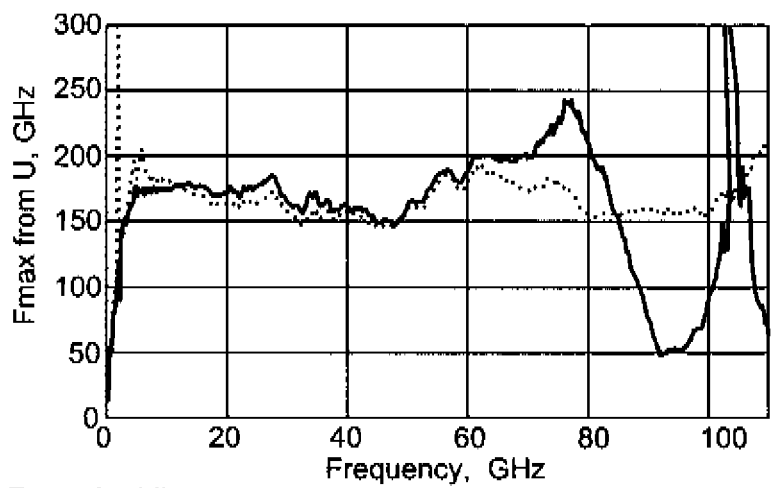
Figure 13A:
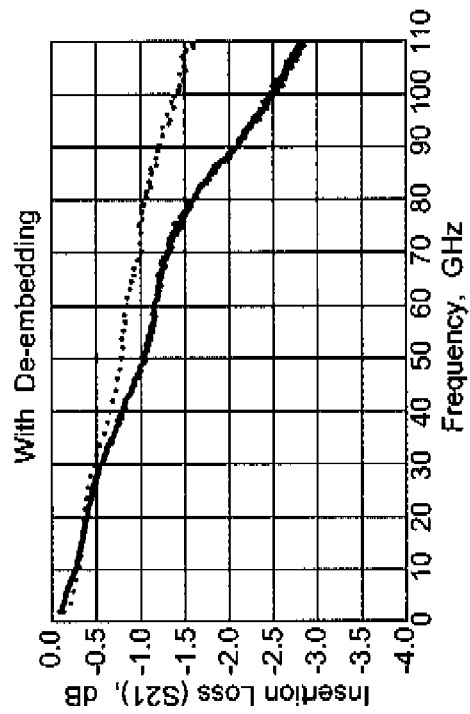
FIGS. 13A-13D show measured S-parameters of CPW and CPWG transmission lines on SiGe HBT wafer. Measurements of S21 magnitude (FIG. 13A) without de-embedding and (FIG. 13B) with de-embedding, and S11 magnitude (FIG. 13C) without de-embedding and (FIG. 13D) with de-embedding are shown.
Figure 13B:
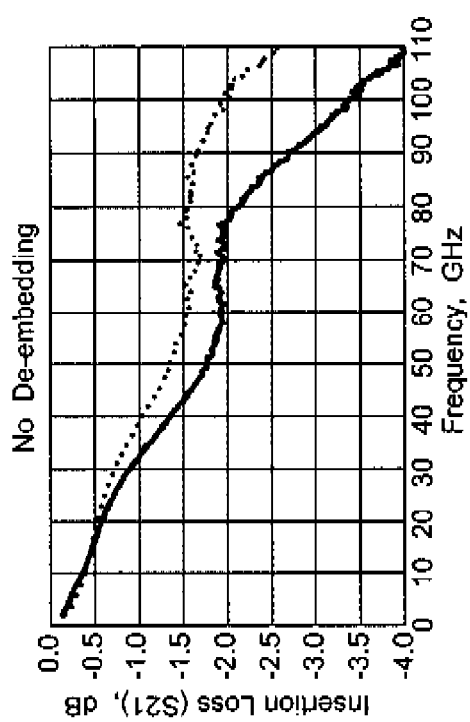
Figure 13C:
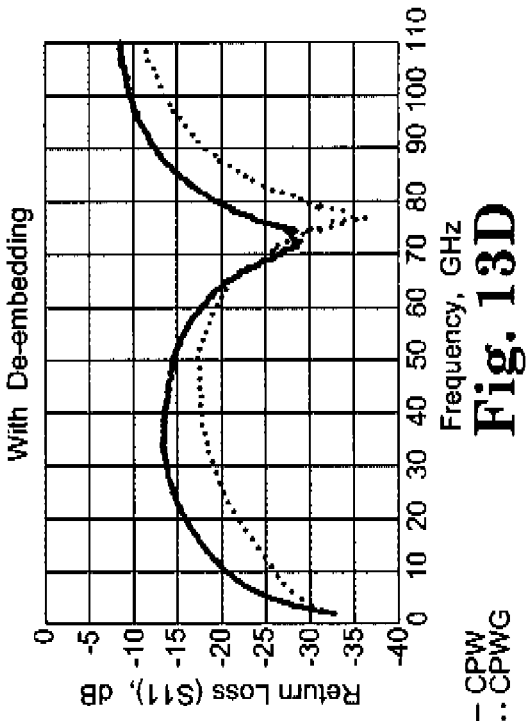
Figure 13D:
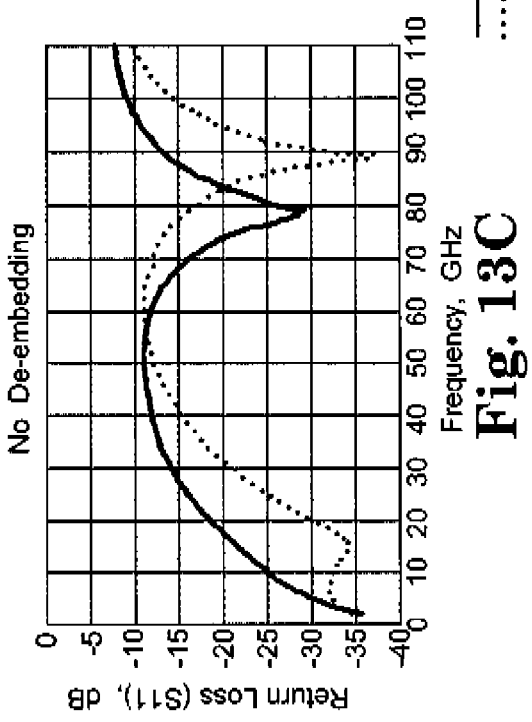

The ft and fmax computed from the measured transistor S-parameters are plotted as a function of frequency in FIGS. 12A-12C. Data de-embedded using both bisect de-embedding and Y subtraction are shown. For each measured frequency, the ft is computed from h21 (FIG. 12A) and the fmax computed both from Gmax (maximum stable gain [MSG]/maximum available gain [MAG]) (FIG. 12B), and U (Mason's unilateral gain, FIG. 12C) by extrapolating the gain at the 20 dB/decade slope predicted by simple transistor small-signal models. A gain metric dropping at the ideal 20 dB/decade rate would show up as a horizontal line in these plots. The two de-embedding methods yield similar results at lower frequencies, but begin to deviate above 60 GHz, where the Y-subtraction data begins to exhibit wide variations over frequency.

Y subtraction amounts to lumped element subtraction of capacitive parasitics. Therefore, the maximum frequency to which this method can be reliably applied depends on the electrical length of the trace de-embedded from each port. In the example shown in FIGS. 12A-12C, the Y subtraction method appears to break down at roughly 60 GHz at which frequency the 225 micron trace length is roughly one eighth of the wavelength (taking into consideration the effective average dielectric constant which is roughly 6). Bisect de-embedding should not suffer from such a limitation in principle, and in fact appears to provide reliable data to higher frequencies. Bisect de-embedding may be used in conjunction with conventional Y and Z subtraction methods to extend their utility to higher frequencies. Use of bisect de-embedding in combination with conventional Y and Z subtraction methods will be described in further detail herein.

In order to measure transmission lines of a fixed cross section (e.g. coaxial cables, printed circuit board traces, thin film metallic traces on ceramic, etc.), the device under test may contain discontinuities of one sort or another at the endpoints (e.g. coaxial connectors, printed circuit board vias, coplanar bond pads, etc.). Again, de-embedding of some type or another may be desired in order to remove the end discontinuities from the measurement so that data representing the uniform transmission line environment may be recovered. Even if the end discontinuities are physically small enough that lumped element approximations are valid, techniques such as Y and Z subtraction are not readily applicable as the two measured ports are typically far removed from one another.

Bisect de-embedding for analysis of coplanar waveguide (CPW) and grounded coplanar waveguide (CPWG) transmission lines fabricated in the metal layers of an IBM 7HP SiGe HBT integrated circuit wafer will now be described. The CPW portions of both lines were placed on the topmost (and thickest) metal layer. The ground for the CPWG structure was provided by a mesh pattern on the bottommost metal layer, whereas the CPW structure was left open to the silicon substrate below. Coplanar probing pads of slightly different lateral geometry than the CPW and CPWG transmission lines, along with smooth transitions to the transmission line dimensions were added to each end of the transmission lines in order to accommodate ground-signal-ground probes with pitches ranging from 50 to 100 microns. The THRU used for de-embedding consisted of back-to-back instances of the probe pad plus transition structure. Measurements were performed using the same equipment and LRRM de-embedding method described above.

Measured S-parameters (insertion loss and return loss with port 1 stimulus) of 1 mm long lines of each type, with and without de-embedding, are shown in FIGS. 13A-13D. Both the raw and de-embedded insertion loss data (FIG. 13A and FIG. 13B, respectively) indicate that the CPWG line is less lossy (due to shielding of the RF energy from the lossy silicon substrate), but the loss is overestimated somewhat without de-embedding, and ripple is more pronounced. Without de-embedding, the return loss of the two T-lines (FIG. 13C) appear comparable in magnitude (suggesting similar impedances), with the CPWG line somewhat electrically shorter than the CPW line (as the dielectric layers between the metal layers are of a lower dielectric constant than the silicon layers). The CPWG line also exhibits some low frequency ripple uncharacteristic of a uniform transmission line. However, after de-embedding (FIG. 13D), the ripple is gone, it is apparent that the impedances differ slightly, and that the difference in electrical length is not as great as otherwise indicated.

Figure 14A:
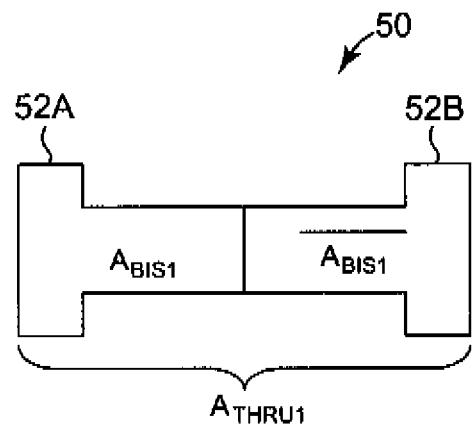
FIGS. 14A-14C show graphical representations of transmission matrix bisect de-embedding, showing (FIG. 14A) a first THRU structure, (FIG. 14B) a second THRU structure and (FIG. 14C) a measurement structure containing embedded device under test.
Figure 14B:
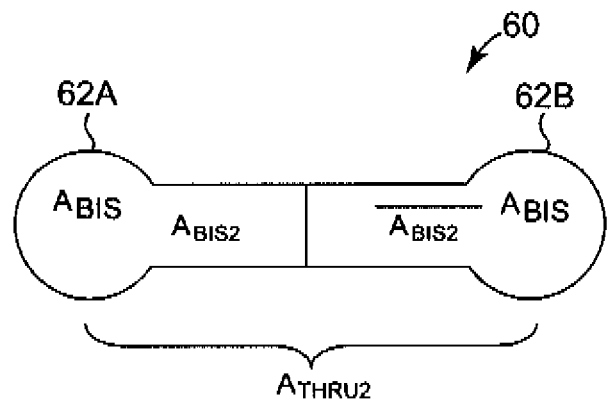
Figure 14C:
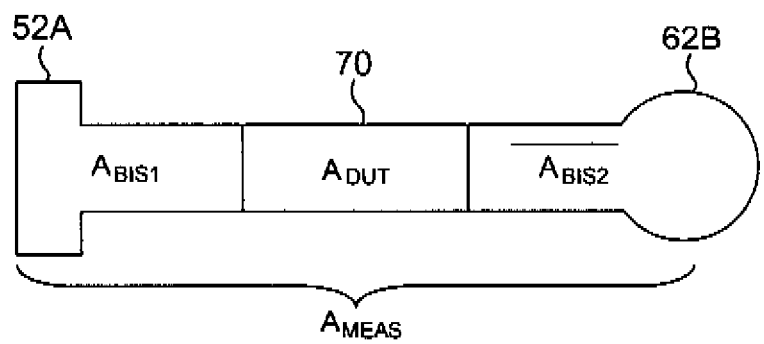

FIGS. 14A-14C show another example environment in which the bisect de-embedding method described herein may be applied. FIG. 14A shows a first symmetric THRU structure, THRU1 50, having two symmetric halves 52A and 52B. FIG. 14B shows a second symmetric THRU structure, THRU2 60, having two symmetric halves 62A and 62B. FIG. 14C shows the device under test (DUT) 70 placed between the first half of the first THRU structure 52A and the second half of the second THRU structure 62B. Note that in this case the THRU structures THRU1 50 and THRU2 60 are each symmetric but are dissimilar to each other. One half of each of the THRU structures 50 and 60 is used to form the two input sections of the two port measurement structure shown in FIG. 14C. The resulting measurement structure shown in FIG. 14C is therefore not itself symmetric about the device under test.

This example of the bisect de-embedding method utilizes transmission matrix mathematics to split each of two substantially symmetric but dissimilar THRU structures, THRU1 50 and THRU2 60, into substantially mirrored halves. One half of each of the THRU structures is used to form the two halves of a two port measurement structure shown in FIG. 14C. The halves of the two dissimilar THRU structures 50 and 60 may then be mathematically removed from both ports of the two port measurement structure, leaving only the DUT 70.

In order to bisect THRU1 and THRU2 into substantially mirror image halves, one desires to solve the following ABCD matrix equations:

$$A_{BIS1} \cdot \overline{A_{BIS1}} = A_{THRU1}, \text{ and}$$

$$A_{BIS2} \cdot \overline{A_{BIS2}} = A_{THRU2}$$

where the overbar indicates symmetric conjugation as described above.

Once $A_{BIS1}$ and $A_{BIS2}$ have been obtained, $A_{DUT}$ can be computed as follows:

$$A_{DUT} = A_{BIS1}^{-1} \cdot A_{MEAS} \cdot (\overline{A_{BIS2}})^{-1}.$$

The bisect de-embedding method can thus be used when one half of each of two substantially symmetric THRU structures is used to form two dissimilar halves of a two port measurement structure.

The technique described with respect to FIGS. 14A-14C may be useful when a use of two halves of a single substantially symmetric THRU structure cannot accurately reflect the physical realities of the measurement structure. This may include, for example, those measurement structures that are not themselves symmetric about the device under test.

Figure 15A:
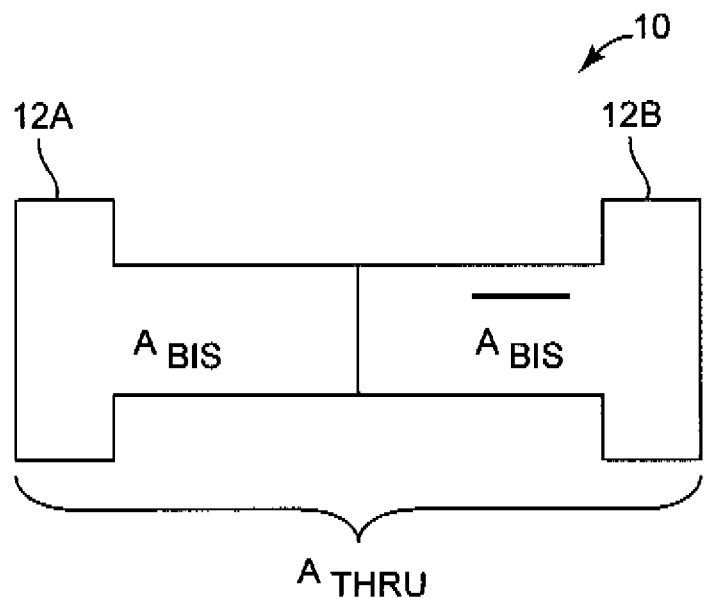
FIGS. 15A and 15B show a graphical representation of transmission matrix bisect de-embedding, showing a THRU structure (FIG. 15A) and a measurement structure containing an embedded device under test (FIG. 15B).
Figure 15B:
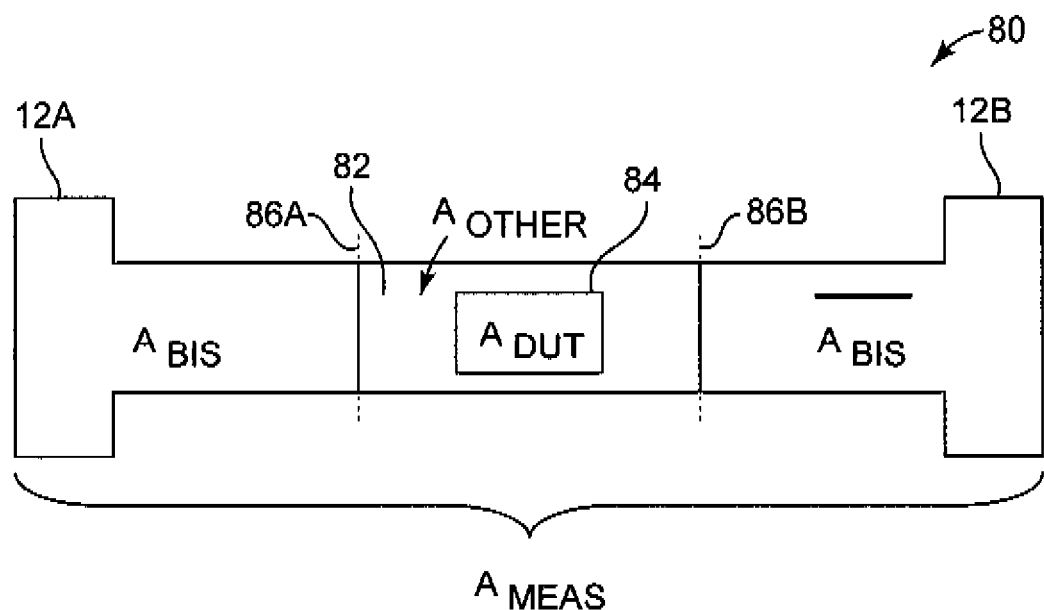

FIGS. 15A-15C show another example environment in which the bisect de-embedding techniques described herein may be applied. FIG. 15A shows a substantially symmetric THRU structure 10 having substantially symmetric mirrored halves 12A and 12B. FIG. 15B shows a measurement structure 80 in which a device under test (DUT) 84 is embedded between the two halves 12A and 12B of the substantially symmetric THRU structure 10.

In this example, reference planes for bisect de-embedding are indicated with reference numerals 86A and 86B. However, once the two halves of the THRU structure outside of reference planes 86A and 86B are mathematically removed via bisect de-embedding, a small area 82 of the measurement structure outside of DUT 84 remains. The transmission characteristics of this small area 82 are indicated as $A_{OTHER}$. $A_{OTHER}$ may be removed using conventional de-embedding techniques, such as Y de-embedding, Z de-embedding, Y+Z de-embedding, Z+Y de-embedding, or other conventionally known de-embedding technique known in the art to obtain the transmission characteristics of the DUT 84.

Bisect de-embedding techniques based on bisection of a single THRU structure and of two dissimilar THRU structures have been described. The de-embedded results compare favorably with alternative methods, and may be combined with conventional methods to improve results over conventional methods alone. Bisect de-embedding techniques may also be applicable to situations other than on-wafer measurements, such as characterization of printed circuit board features.

Even in cases where the mathematical equations representing the THRU bisection may have many solutions or even no exact solution, the algorithm converges to a useful solution. The bisect de-embedding method can be effectively utilized for de-embedding of measured VNA data, as has been shown through several on-wafer measurement examples. The bisection method, and hence the de-embedding method, is not limited by lumped element considerations or other such constraints, allowing applicability to high frequency measurements and/or large delay elements. Comparison with alternative methods indicate that the bisect de-embedding method agrees with well established methods within the range of parameters in which agreement is expected, and it offers benefits complementary to these established methods outside of the range of parameters in which agreement is expected.

Figure 16:
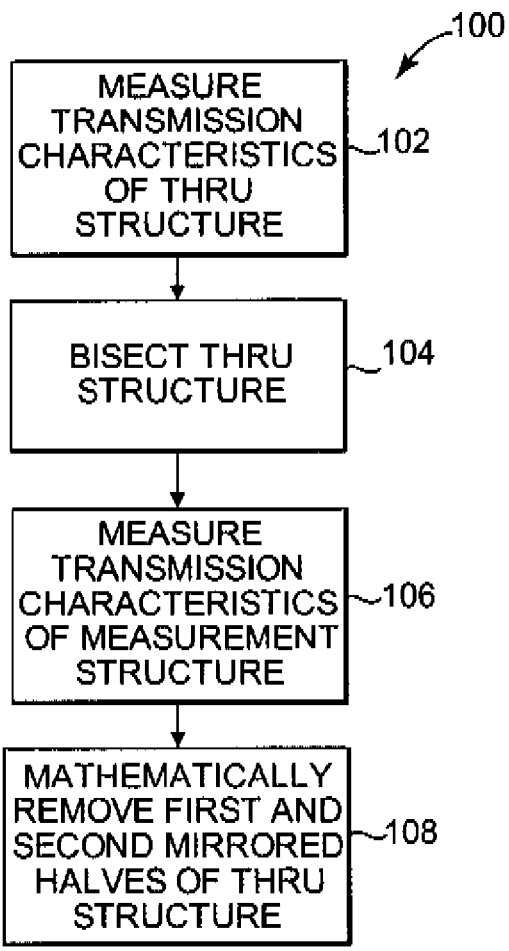
FIG. 16 is a flowchart illustrating an example bisect de-embedding process such as that described above with respect to FIGS. 1A-1B.

FIG. 16 is a flowchart illustrating an example bisect de-embedding process 100 such as that described above with respect to FIGS. 1A-1B. The method includes measuring transmission characteristics of a substantially symmetric THRU structure (102). The measured transmission characteristics of the THRUS structure are bisected into first and second substantially mirrored halves (104). Transmission characteristics of a measurement structure containing a device under test embedded between the first and second mirrored halves (106) are measured. The transmission characteristics of the first and second mirrored halves are mathematically removed from the measured transmission characteristics of the measurement structure to determine the transmission characteristics of the device under test (108).

Figure 17:
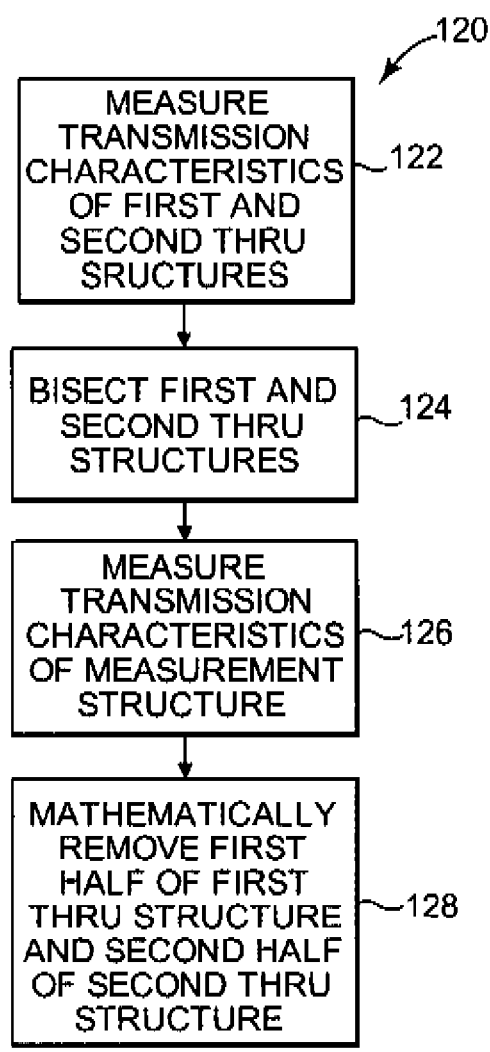
FIG. 17 is a flowchart illustrating an example bisect de-embedding process such as that described above with respect to FIGS. 14A-14C.

FIG. 17 is a flowchart illustrating an example bisect de-embedding process 120 such as that described above with respect to FIGS. 14A-14C. The method includes measuring transmission characteristics of first and second substantially symmetric THRU structures (122). The method bisects the transmission characteristics of the first substantially symmetric THRU structure, THRU1, into first and second substantially mirrored halves, and bisects transmission characteristics of the second substantially symmetric THRU structure, THRU2, into first and second substantially mirrored halves (124). Transmission characteristics of a measurement structure containing a device under test embedded between the first half of the first substantially symmetric THRU structure, THRU1, and the second half of the second substantially symmetric THRU structure, THRU2 are measured (126). The transmission characteristics of the first half of the first substantially symmetric THRU structure, THRU1, and the second half of the second substantially symmetric THRU structure, THRU2, are mathematically removed from the measured transmission characteristics of the measurement structure to determine the transmission characteristics of the device under test (128).

Figure 18:
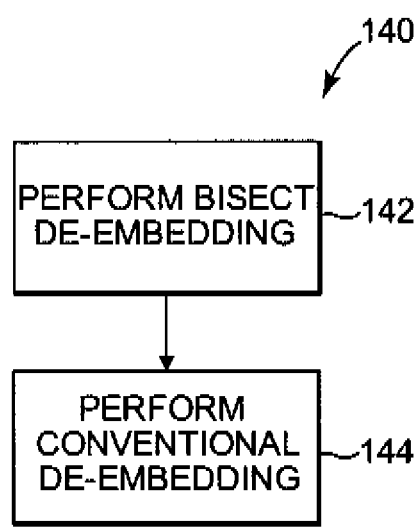
FIG. 18 is a flowchart illustrating an example process for de-embedding a device under test using a combination of bisect de-embedding and a conventional de-embedding technique.

FIG. 18 is a flowchart illustrating an example process (140) for de-embedding a device under test using a combination of bisect de-embedding and a conventional de-embedding technique, such as Y de-embedding, Z de-embedding, Y+Z de-embedding, Z+Y de-embedding, or other conventionally known de-embedding technique known in the art. In this example, the DUT is first de-embedded using the bisect de-embedding techniques described above to obtain a set of intermediate transmission characteristics (142). The resulting intermediate transmission characteristics may then be further de-embedded using conventionally known de-embedding techniques to determine the transmission characteristics of the device under test (144). The bisect de-embedding technique (142) employed may be one of the techniques described above with respect to FIG. 1, FIGS. 14A-14C, or FIG. 15A-15B, for example.

As discussed above with respect to Equation (3), for a substantially symmetric THRU, once the transmission matrix $A_{BIS}$ for the first half of the symmetric THRU (such as first half 12A of THRU 10 of FIGS. 1 and 15A, first half 52A of FIG. 14A, first half 62A of FIG. 14B, or first (left) half 202A of FIGS. 20-22, or other examples not shown herein) has been obtained, $A_{DUT}$ (the transmission matrix for the device under test) may be computed as follows:

$$A_{DUT} = A_{BIS}^{-1} \cdot A_{MEAS} \cdot (\overline{A_{BIS}})^{-1} \qquad (3)$$

This may be written in expanded form as follows:

$$\begin{bmatrix} A_{DUT} & B_{DUT} \\ C_{DUT} & D_{DUT} \end{bmatrix} = \begin{bmatrix} A_{T1} & B_{T1} \\ C_{T1} & D_{T1} \end{bmatrix}^{-1} \begin{bmatrix} A_{mcas} & B_{mcas} \\ C_{mcas} & D_{mcas} \end{bmatrix} \begin{bmatrix} A_{T2} & B_{T2} \\ C_{T2} & D_{T2} \end{bmatrix}^{-1} \qquad (7)$$

As discussed above, for a substantially symmetric THRU, a Levenberg-Marquardt (L-M) or other optimization of the complex components a, b, c, and d at each frequency point may be performed, subject to the constraints defined in the above equation for $A_{BIS}$. Using the L-M optimization, for example, data points $y_i$ may be fit to some function y=y(x;a); a are the parameters (fixed for all data sets) $\{a_1, a_2, \ldots, a_m\}$, where m is the number of parameters; x is the "ordinate"—associated with each $y_i$ is an $x_i$, i=1, ..., N, where N is the number of data points. For a substantially symmetric THRU:

$$y_i \Rightarrow \begin{Bmatrix} A_{THRU} \\ B_{THRU} \\ C_{THRU} \\ D_{THRU} \\ 1 \end{Bmatrix} \quad x_i \Rightarrow \begin{Bmatrix} 1 \\ 2 \\ 3 \\ 4 \\ 5 \end{Bmatrix} \quad a_i \Rightarrow \begin{Bmatrix} A \\ B \\ C \\ D \end{Bmatrix} \qquad (8)$$

$$\begin{Bmatrix} y(1.a) \\ y(2.a) \\ y(3.a) \\ y(4.a) \\ y(5.a) \end{Bmatrix} \Rightarrow \begin{Bmatrix} \frac{AD+BC}{AD-BC} \\ \frac{2AB}{AD-BC} \\ \frac{2CD}{AD-BC} \\ \frac{AD+BC}{AD-BC} \\ \frac{AD-BC}{AD-BC} \end{Bmatrix} = y_i(\text{at optimum}) = \begin{Bmatrix} A_{THRU} \\ B_{THRU} \\ C_{THRU} \\ D_{THRU} \\ 1 \end{Bmatrix} \qquad (9)$$

$\rho_i$=relative error for each $y_i$. Given typical $Z_0$–50, try the following:

$$\sigma_i = \begin{Bmatrix} 1 \\ 50 \\ 1/50 \\ 1 \\ 0.1 \end{Bmatrix} \qquad (10)$$

this reflects the example AD−BC=1.

When the Levenberg-Marquardt optimization described in the above is used to solve for the ABCD parameters (e.g., W. H. Press, A. A. Teukolsky, W. T. Vetterling, and B. P. Flannery, *Numerical Recipes in C*, Second Edition ed: Cambridge University Press, 1992, pp. 683-688), equations (8) and (9) may be written to account for the fact that the L-M routines are not designed for complex numbers. Thus, equations (8) and (9) above may be rewritten for real and imaginary parts as 10 points, 8 parameters instead of 5 points, 4 parameters:

$$y_i \Rightarrow \begin{Bmatrix} A_{THRU,r} \\ A_{THRU,i} \\ B_{THRU,r} \\ B_{THRU,i} \\ C_{THRU,r} \\ C_{THRU,i} \\ D_{THRU,r} \\ D_{THRU,i} \\ 1 \\ 0 \end{Bmatrix} \quad x_i = \begin{Bmatrix} 1 \\ 2 \\ 3 \\ 4 \\ 5 \\ 6 \\ 7 \\ 8 \\ 9 \\ 10 \end{Bmatrix} \quad a_j = \begin{Bmatrix} A_r \\ A_i \\ B_r \\ B_i \\ C_r \\ C_i \\ D_r \\ D_i \end{Bmatrix} \quad (11)$$

$$\begin{Bmatrix} y(1;2,a) \\ y(3;4,a) \\ y(5;6,a) \\ y(7;8,a) \\ y(9;10,a) \end{Bmatrix} x_i = \begin{Bmatrix} \text{Re}/\text{Im}\{(AD+BC)/(AD-BC)\} \\ \text{Re}/\text{Im}\{2AB/(AD-BC)\} \\ \text{Re}/\text{Im}\{2BC/(AD-BC)\} \\ \text{Re}/\text{Im}\{(AD+BC)/(AD-BC)\} \\ \text{Re}/I\{AD-B\} \end{Bmatrix} \quad (12)$$

$$\sigma_i = \begin{Bmatrix} 1 \\ 1 \\ 50 \\ 50 \\ 1/50 \\ 1/50 \\ 1 \\ 1 \\ 0.1 \\ 0.1 \end{Bmatrix}$$

Derivatives of y(xi; a) may be determined. These are analytic functions, so the Cauchy-Riemann equations may be used: given z=x+iy, if f(z)=U(x,y)=iV(x,y) then $$\frac{\partial f}{\partial z} = \frac{\partial u}{\partial x} + i\frac{\partial v}{\partial x} = \quad (13)$$

$$\frac{\partial v}{\partial y} - i\frac{\partial u}{\partial y} \Longrightarrow \frac{\partial u}{\partial x} = \frac{\partial v}{\partial y} = \text{Re}\left\{\frac{\partial f}{\partial z}\right\} : -\frac{\partial v}{\partial y} = +\frac{\partial v}{\partial x} = \text{Im}\left\{\frac{\partial f}{\partial z}\right\}$$

Partial derivatives:

For indices 1/2 and 7/8:

$$\frac{\partial}{\partial A}\left(\frac{AD+BC}{AD-BC}\right) = \frac{D(AD-BC)-D(AD+BC)}{(AD-BC)^2} = \frac{-2BCD}{(AD-BC)^2} \quad (14)$$

$$\frac{\partial}{\partial B}\left(\frac{AD+BC}{AD-BC}\right) = \frac{C(AD-BC)-C(AD+BC)}{(AD-BC)^2} = \frac{2ACD}{(AD-BC)^2}$$

$$\frac{\partial}{\partial C}\left(\frac{AD+BC}{AD-BC}\right) = \frac{B(AD-BC)-B(AD+BC)}{(AD-BC)^2} = \frac{2ABD}{(AD-BC)^2}$$

$$\frac{\partial}{\partial D}\left(\frac{AD+BC}{AD-BC}\right) = \frac{A(AD-BC)-A(AD+BC)}{(AD-BC)^2} = \frac{-2ABC}{(AD-BC)^2}$$

For indices 3/4:

$$\frac{\partial}{\partial A}\left(\frac{2AB}{AD-BC}\right) = \frac{-2B^2C}{(AD-BC)^2} \quad (15)$$

$$\frac{\partial}{\partial B}\left(\frac{2AB}{AD-BC}\right) = \frac{2A^2D}{(AD-BC)^2}$$

$$\frac{\partial}{\partial C}\left(\frac{2AB}{AD-BC}\right) = \frac{2AB^2}{(AD-BC)^2}$$

$$\frac{\partial}{\partial D}\left(\frac{2AB}{AD-BC}\right) = \frac{-2A^2B}{(AD-BC)^2}$$

For indices 5/6:

$$\frac{\partial}{\partial A}\left(\frac{2CD}{AD-BC}\right) = \frac{-2CD^2}{(AD-BC)^2} \quad (16)$$

$$\frac{\partial}{\partial B}\left(\frac{2CD}{AD-BC}\right) = \frac{2C^2D}{(AD-BC)^2}$$

$$\frac{\partial}{\partial C}\left(\frac{2CD}{AD-BC}\right) = \frac{2AD^2}{(AD-BC)^2}$$

$$\frac{\partial}{\partial D}\left(\frac{2CD}{AD-BC}\right) = \frac{-2BC^2}{(AD-BC)^2}$$

For indices 9/10:

$$\frac{\partial}{\partial A}(AD-BC) = D \quad (17)$$

$$\frac{\partial}{\partial B}(AD-BC) = -C$$

$$\frac{\partial}{\partial C}(AD-BC) = -B$$

$$\frac{\partial}{\partial D}(AD-BC) = A$$

The above equations may be hard-coded into a Levenberg-Marquardt (L-M) or other optimization algorithm to determine the transmission characteristics (ABCD parameters) of the substantially symmetric THRU.

Figure 19:
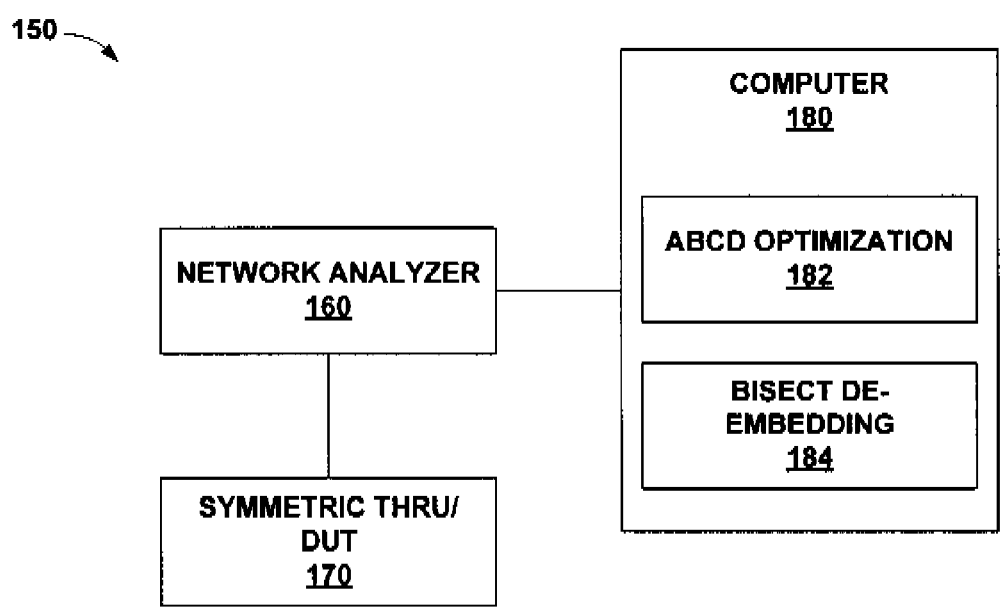
FIG. 19 shows an example measurement set up for measuring the s-parameters of a measurement structure including, for example, a symmetric THRU and/or a symmetric THRU having an embedded DUT.

FIG. 19 shows an example measurement set up 150 for measuring the s-parameters of a measurement structure 170. Measurement structure 170 may include, for example, a symmetric THRU, one half of a symmetric THRU, and/or a symmetric THRU having an embedded DUT, or other appropriate measurement structure. Measurement structure 170 is connected to a vector network analyzer (VNA) 160, which in turn is connected (via a wired or wireless connection) to communicate with a computer 180 or other data processing apparatus. A typical VNA 160 may include an variable frequency source, a control panel, an information display, and input/output ports through which the measurement structure 170 is connected, and a internal controller to manipulate and store data.

To obtain the s-parameters of the measurement structure 170, VNA 160 performs a "frequency sweep" taking measurements at each frequency over a desired frequency range. The frequency sweep may be undertaken using a linear or logarithmic method to obtain measurements over the entire frequency range. The results may be displayed in different formats as magnitude, phase, real part, imaginary part, group delay, etc. Also, polar plots for gain and impedance measurements as well as Bode plots or Smith charts for reflection measurements may also be available by VNA 160.

Computer 180 includes a memory or other data storage device (not shown) that stores an ABCD optimization module 182 and a bisect de-embedding module 184. The software modules 182 and 184 may be executed by one or more processors internal to computer 180. ABCD optimization module 182 receives the s-parameters of the symmetric THRU obtained by VNA 160 and executes an optimization routine to determine the ABCD parameters of the symmetric THRU. Bisect de-embedding module 184 receives the s-parameters of the symmetric THRU/embedded DUT obtained by VNA 160 and calculates the ABCD parameters of the DUT using vector matrix mathematics as shown in equation (3). Alternatively, software modules 182 and 184 may be stored and executed by the VNAs internal controller.

Additional measurements may be taken of a substantially symmetric THRU that may in some cases improve the results obtained by optimization module 182. For example, a short circuit may be applied to the one half of the THRU structure, the response (s-parameters) of the short-circuited half of the THRU may be measured, and these measurements may be taken into account during the optimization process. In addition or alternatively, an open-circuit may be applied to one half of the THRU structure, the response of the open-circuited half of the THRU measured, and these measurements may taken into account during the optimization process. Measurements of one or both of the open and/or short may be used, and these techniques may help to improve the results obtained by optimization module 182 and thus may help to improve de-embedding accuracy.

The short-circuited structure may be referred to as a "SHORT". In some examples, the SHORT may be assumed to be a perfect short. In other examples, additional higher power terms of the frequency and parasitic inductances may be taken into account to approximate a non-perfect short. Similarly, the open-circuited structure may be referred to as an "OPEN". In some examples, the OPEN may be assumed to be a perfect open circuit. In other examples, additional higher power terms of the frequency and parasitic capacitances may be taken into account to approximate a non-perfect open.

Figure 20:
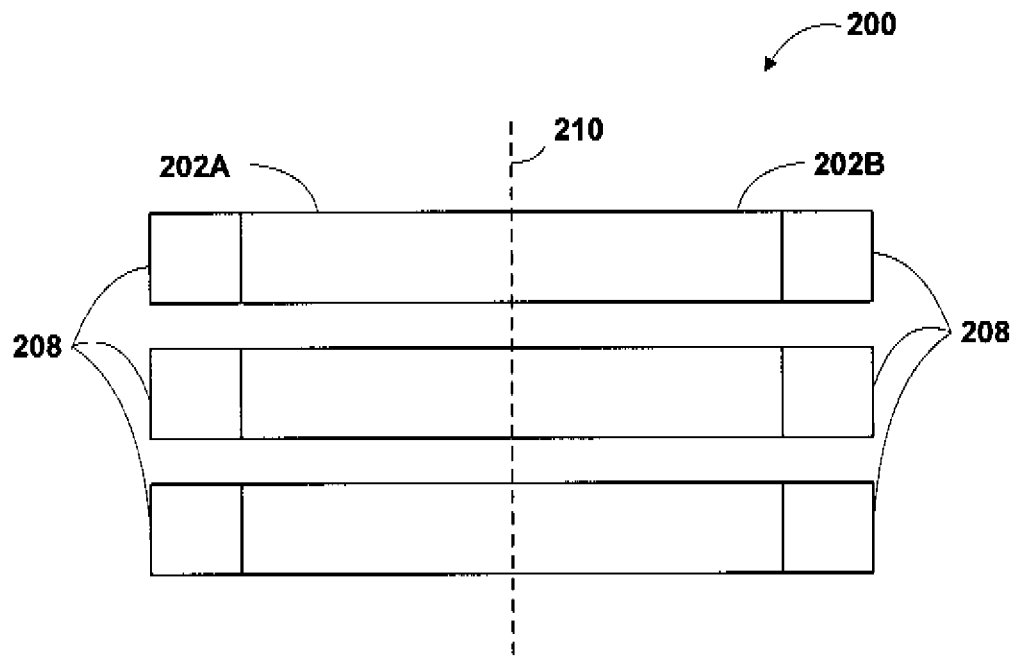
FIG. 20 shows an example symmetric THRU structure.
Figure 21:
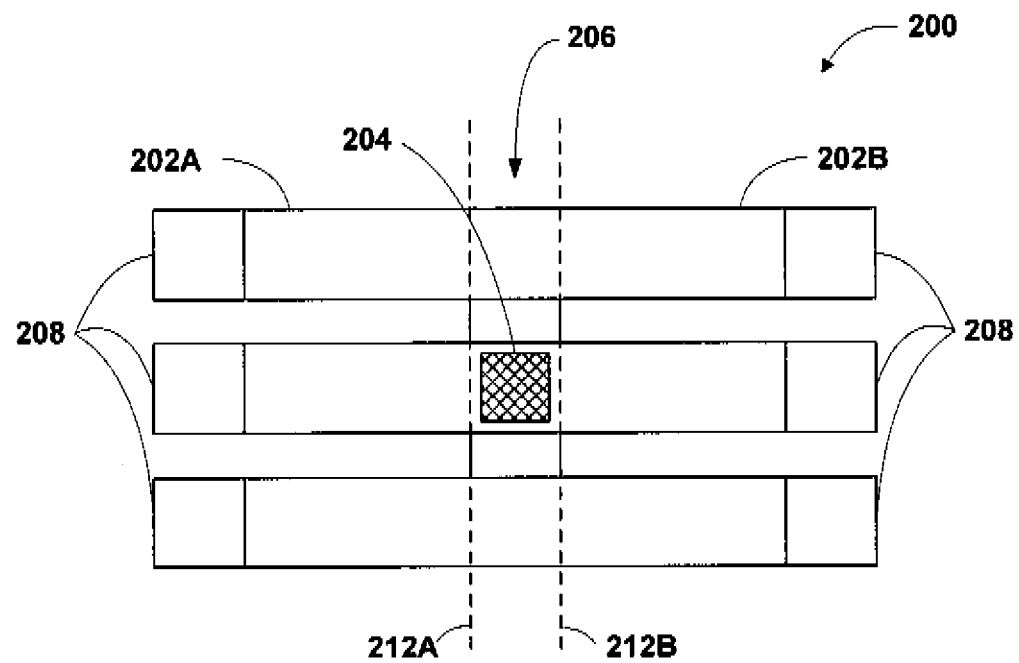
FIG. 21 shows an example measurement setup for measuring characteristics of a device under test (DUT) using a substantially symmetric THRU 200.

FIG. 20 shows an example substantially symmetric THRU structure 200. THRU 200 is substantially symmetric about line of bi-section 210, and includes first and second mirrored halves 202A and 202B, respectively. Probe pads 208 of THRU 200 are also shown in this example. FIG. 21 shows an example measurement setup 200 that measures transmission characteristics of a device under test (DUT) 204 using symmetric THRU 200 and the de-embedding techniques described herein. In FIG. 21, an example measurement structure 206 includes a DUT 204 embedded between the reference planes 212A and 212B of substantially symmetric THRU 200.

Figure 22:
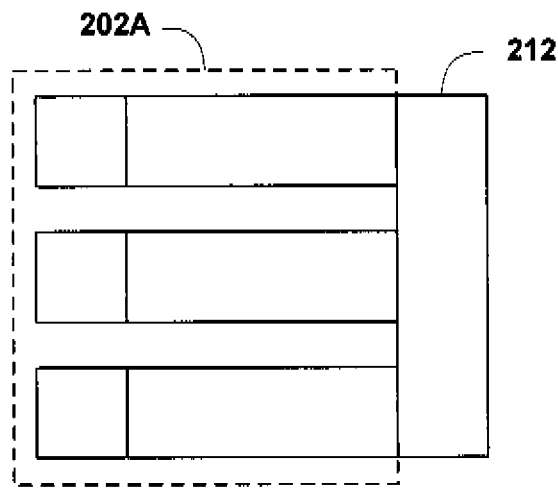
FIG. 22 shows an example representation of a SHORT to the left half of a substantially symmetric THRU.

FIG. 22 shows an example representation of a SHORT to the left half 202A of symmetric THRU 200. In this example, a SHORT may be implemented using the left hand side of the THRU with short circuit to ground with a plated through-hole via or alternative shorting technique at the line of bi-section, i.e., the far right side of the left half of symmetric THRU 202A, as represented by reference numeral 212. In this example, the SHORT has only one port and as such only the return loss measurement, $S_{11}$, is available. The $S_{11}$ parameter of the SHORT may be determined, for example, as described below.

Figure 23:
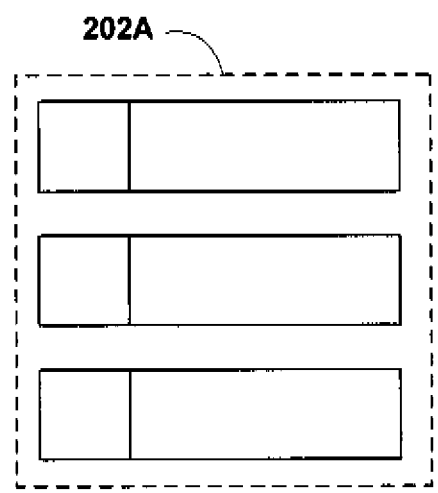
FIG. 23 shows an example representation of an OPEN to the left half of a substantially symmetric THRU.

FIG. 23 shows an example representation of an OPEN to the left half 202A of symmetric THRU 200. An OPEN may be implemented using the left half 202A of symmetric THRU 200 without presence of a measurement structure, DUT or other circuit elements. As with the SHORT of FIG. 22, in this example the OPEN has only one port and as such only the return loss measurement, $S_{11}$, is available. The $S_{11}$ parameter of the OPEN may be determined, for example, as described below.

Figure 24:
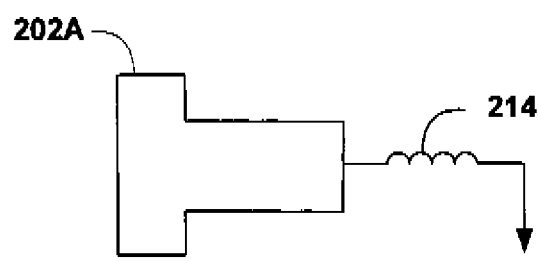
FIG. 24 is an example representation of a SHORT as applied to the left half of a substantially symmetric THRU that accounts for parasitic inductance.
Figure 25:
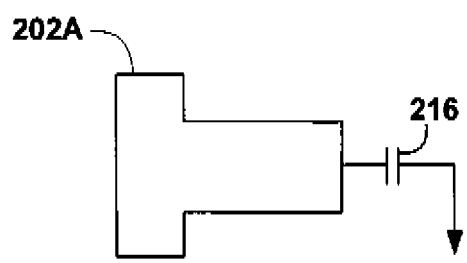
FIG. 25 is an example representation of an OPEN as applied to the left half of a substantially symmetric THRU that accounts for parasitic capacitance.

FIG. 24 is an example representation of a SHORT as applied to the left half 202 of a symmetric THRU that accounts for parasitic inductance. The parasitic inductance is represented by reference numeral 214. FIG. 25 is an example representation of an OPEN as applied to the left half 202 of a symmetric THRU that accounts for parasitic capacitance. The parasitic capacitance is represented by reference numeral 216.

To account for parasitic capacitances involved with the OPEN, equations involving the product of higher order frequency terms with the parasitic capacitance may be introduced to those of the ideal OPEN. Similarly, to account for parasitic inductances involved with the SHORT, equations involving the product of higher order frequency terms with the parasitic inductance may be introduced to those of the ideal SHORT. Parasitic capacitance/inductance may be estimated by electromagnetic simulation or by another means. Alternatively, the parasitic capacitance/inductance can be assigned to an unknown and calculated during the Levenberg-Marquardt optimization along with the ABCD parameters.

Figure 26:
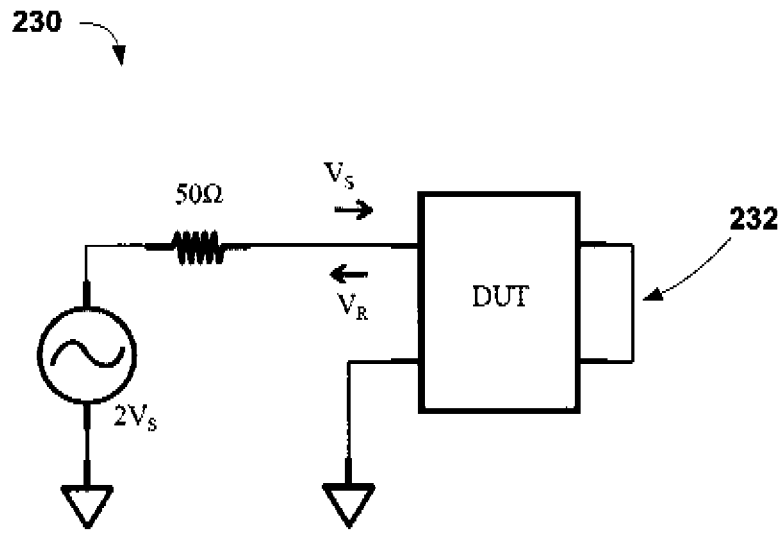
FIG. 26 shows an example of a shorted two-port network.

Assuming for purposes of this example a perfect short (e.g., no parasitic inductance) the SHORT has only one port and as such only the return loss measurement, $S_{11}$, is available. $S_{11}$ may be converted to ABCD parameters. To convert $S_{11}$ to ABCD parameters, the definition of S-Parameters for a shorted two-port network 230 is shown in FIG. 26. $S_{11} \partial V_r$, where $V_r$ is the reflected voltage in response to the one-volt source that is incident at the 50Ω impedance and SHORT structure. $V_r$ is governed by the equation:

$$Vr = \frac{Z_{DUT} - 50\ \Omega}{Z_{DUT} + 50\ \Omega}$$

From the definition of an ABCD network:

$$\begin{bmatrix} V_1 \\ I_1 \end{bmatrix} = \begin{bmatrix} A_1 & B_1 \\ C_1 & D_1 \end{bmatrix} \begin{bmatrix} V_2 \\ I_2 \end{bmatrix}$$

If Port 2 of the ABCD network is shorted, then $V_2=0$. Therefore $$V_1 = BI_2 \text{ and } I_1 = DI_2 \text{ or } V_1/I_1 = B/D.$$

However, $V_1/I_1$ is simply $Z_{DUT}$ with port 2 shorted. Or $B/D = Z_{DUT}$. Therefore, $$S_{11SHORT} = Vr = \frac{Z_{DUT} - 50\ \Omega}{Z_{DUT} + 50\ \Omega} = \frac{B/D - 50}{B/D + 50}$$

Figure 27:
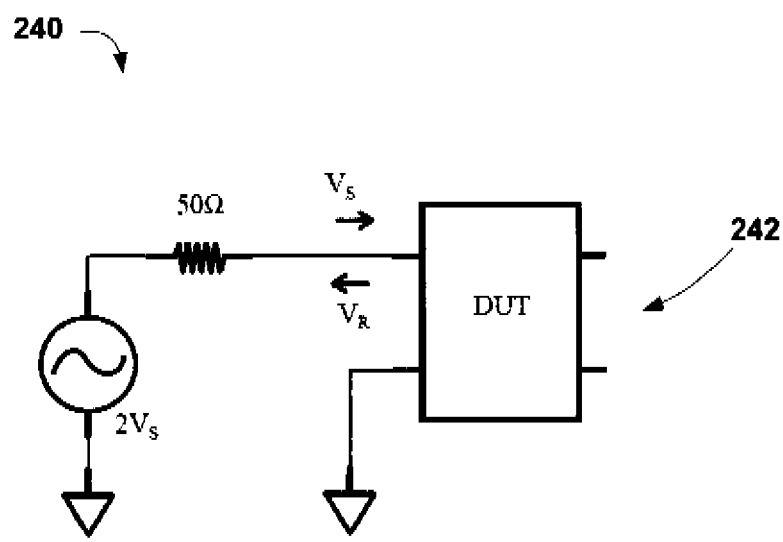
FIG. 27 shows an example of open two-port network.

In addition or alternatively, instead of a short-circuited structure, an open-circuited structure (referred to as an "OPEN") may be considered in regards to improving bisection de-embedding accuracy. In a similar process to determining equations for a SHORT, the equations for an OPEN circuit (at Port 2, see, e.g., FIG. 27, reference numeral 242) can be obtained by the associated equations above with $I_2=0$ then $$S_{11OPEN} = Vr = \frac{Z_{DUT} - 50\ \Omega}{Z_{DUT} + 50\ \Omega} = \frac{A/C - 50}{A/C + 50}$$

In some examples, only one of either the SHORT or the OPEN may be considered during the optimization process. In other examples, both the SHORT and the OPEN may be considered during the optimization process. Because some fabrication technologies lend themselves for better quality SHORTs than OPENs, or vice-versa, either one or both of the OPEN and SHORT structures may be chosen to obtain the desired de-embedding results.

The SHORT and/or the OPEN equations may be added to the above equations for a substantially symmetric THRU and taken into account during the optimization process. This may in some cases improve the results of the ABCD optimization and therefore increase de-embedding accuracy. In the following example, the mapping equations of both a SHORT and an OPEN are included. If either SHORT or OPEN are not available or yield poor quality measurements then the equations may be extended only to the better quality OPEN or SHORT, if desired.

For the purpose of this example, assuming both the OPEN and SHORT are to be used, $y_i$ and $x_i$ of the L-M optimization change as below. Because the ABCD parameters of the substantially symmetric THRU are being solved for, $a_j$ remains the same:

$$y_i \Rightarrow \begin{Bmatrix} A_{THRU} \\ B_{THRU} \\ C_{THRU} \\ D_{THRU} \\ 1 \\ S_{11,SHORT} \\ S_{11,OPEN} \end{Bmatrix} \quad x_i \Rightarrow \begin{Bmatrix} 1 \\ 2 \\ 3 \\ 4 \\ 5 \\ 6 \\ 7 \end{Bmatrix} \quad a_j \Rightarrow \begin{Bmatrix} A \\ B \\ C \\ D \end{Bmatrix} \quad (18)$$

$$\begin{Bmatrix} y(1,a) \\ y(2,a) \\ y(3,a) \\ y(4,a) \\ y(5,a) \\ y(6,a) \\ y(7,a) \end{Bmatrix} \Rightarrow \begin{Bmatrix} \frac{AD+BC}{AD-BC} \\ \frac{2AB}{AD-BC} \\ \frac{2CD}{AD-BC} \\ \frac{AD+BC}{AD-BC} \\ AD-BC \\ \frac{B/D-50}{B/D+50} \\ \frac{A/C-50}{A/C+50} \end{Bmatrix} = y_i \text{ (at optimum)} = \begin{Bmatrix} A_{THRU} \\ B_{THRU} \\ C_{THRU} \\ D_{THRU} \\ 1 \\ S_{11,SHORT} \\ S_{11,OPEN} \end{Bmatrix} \quad (19)$$

The bottom of the vector below may be added to define the relative error $\rho_i$ as found below. In this example, assume the return loss from the SHORT or OPEN structure to have magnitude nearly equal to unity which means that the weighting factors for the error should be approximately 1.

$$\sigma_i = \begin{Bmatrix} 1 \\ 50 \\ 1/50 \\ 1 \\ 0.1 \\ 1 \\ 1 \end{Bmatrix} \quad (20)$$

Substituting for real and imaginary parts:

$$y_i \Rightarrow \begin{Bmatrix} A_{THRU,r} \\ A_{THRU,i} \\ B_{THRU,r} \\ B_{THRU,i} \\ C_{THRU,r} \\ C_{THRU,i} \\ D_{THRU,r} \\ D_{THRU,i} \\ 1 \\ 0 \\ S_{11,SHORT,r} \\ S_{11,SHORT,i} \\ S_{11,OPEN,r} \\ S_{11,OPEN,i} \end{Bmatrix} \quad x_i = \begin{Bmatrix} 1 \\ 2 \\ 3 \\ 4 \\ 5 \\ 6 \\ 7 \\ 8 \\ 9 \\ 10 \\ 11 \\ 12 \\ 13 \\ 14 \end{Bmatrix} \quad a_j = \begin{Bmatrix} A_r \\ A_i \\ B_r \\ B_i \\ C_r \\ C_i \\ D_r \\ D_i \end{Bmatrix} \quad (21)$$

$$y_i \Rightarrow \begin{Bmatrix} y(1;2,a) \\ y(3;4,a) \\ y(5;6,a) \\ y(7;8,a) \\ y(9;10,a) \\ y(11;12,a) \end{Bmatrix} \quad (22)$$

$$x_i = \begin{Bmatrix} \text{Re}/\text{Im}\{(AD+BC)/(AD-BC)\} \\ \text{Re}/\text{Im}\{2AB/(AD-BC)\} \\ \text{Re}/\text{Im}\{2BC/(AD-BC)\} \\ \text{Re}/\text{Im}\{(AD+BC)/(AD-BC)\} \\ \text{Re}/\text{Im}\{AD-BC\} \\ \text{Re}/\text{Im}\{(B/D-50)/(B/D+50)\} \\ \text{Re}/\text{Im}\{(A/C-50)/(A/C+50)\} \end{Bmatrix} \quad \sigma_i = \begin{Bmatrix} 1 \\ 1 \\ 50 \\ 50 \\ 1/50 \\ 1/50 \\ 1 \\ 1 \\ 0.1 \\ 0.1 \\ 1 \\ 1 \\ 1 \\ 1 \end{Bmatrix}$$

Now the partial derivatives for the additional SHORT equation may be determined:

for indices 11/12:

$$\frac{\partial}{\partial B}\left(\frac{\frac{B}{D}-50}{\frac{B}{D}+50}\right) = \frac{100D}{(B+50D)^2} \quad (23)$$

$$\frac{\partial}{\partial D}\left(\frac{\frac{B}{D}-50}{\frac{B}{D}+50}\right) = \frac{-100B}{(B+50D)^2}$$

and for the additional OPEN equation:

for indices 13/14:

$$\frac{\partial}{\partial A}\left(\frac{\frac{A}{C}-50}{\frac{A}{C}+50}\right) = \frac{100C}{(A+50C)^2} \quad (24)$$

-continued $$\frac{\partial}{\partial C}\left(\frac{\frac{A}{C}-50}{\frac{A}{C}+50}\right) = \frac{-100A}{(A+50C)^2}$$

Figure 28:
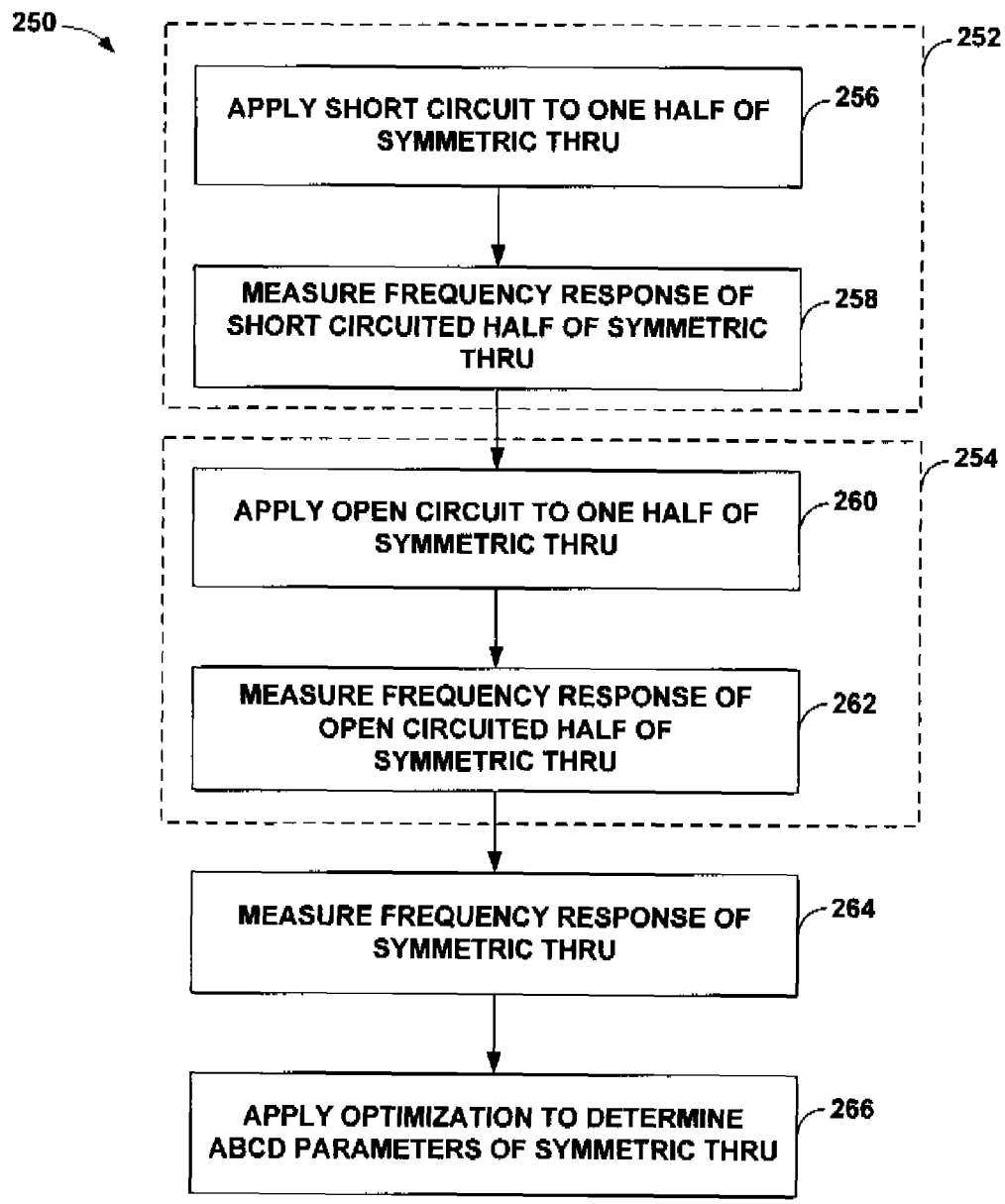
FIG. 28 is a flowchart illustrating an example process by which the ABCD parameters of a substantially symmetric THRU may be determined using one or both of the OPEN and/or SHORT techniques described herein.

FIG. 28 is a flowchart illustrating an example process (250) by which the ABCD parameters of a substantially symmetric THRU may be determined using one or both of the OPEN and/or SHORT techniques described herein. In process 250, either one or both of the SHORT (252) or OPEN (254) techniques may be used. In an example where the SHORT technique is used (252), a short circuit is applied to one half of the symmetric THRU (256). The frequency response (e.g., s-parameters over the desired frequency range) of the short-circuited half of the symmetric THRU are measured (258). In an example where the OPEN technique is used (254), an open circuit is applied to one half of the symmetric THRU (260). The frequency response (e.g., s-parameters over the desired frequency range) of the open-circuited half of the symmetric THRU are measured (262). The frequency response (e.g., s-parameters over the desired frequency range) of the substantially symmetric THRU are also measured (264). The various s-parameter measurements may be obtained via a vector network analyzer (VNA) such as VNA 160 of FIG. 19, or by other methods.

Once the frequency response of the SHORT and/or the OPEN and the substantially symmetric THRU are obtained, an optimization routine is applied to determine the ABCD parameters of the substantially symmetric THRU (266). This optimization may be a programmed software module such as ABCD optimization module 182 shown in FIG. 19, and may be stored and/or executed by computer 180 or a controller internal to VNA 160, for example. The optimization (266) may include an optimization of the partial derivative equations (14)-(17) associated with the substantially symmetric THRU and one or both of the partial derivative equations (23) associated with the SHORT and/or the partial derivative equations (24) associated with the OPEN. If optimization techniques other than the example L-M optimization are used, the equations may vary somewhat; however, those of skill in the art will readily understand that the disclosure is not limited to the specific type of optimization or optimization equations described herein, and that other optimization techniques and associated equations may also be used without departing from the scope of the present disclosure.

Figure 29:
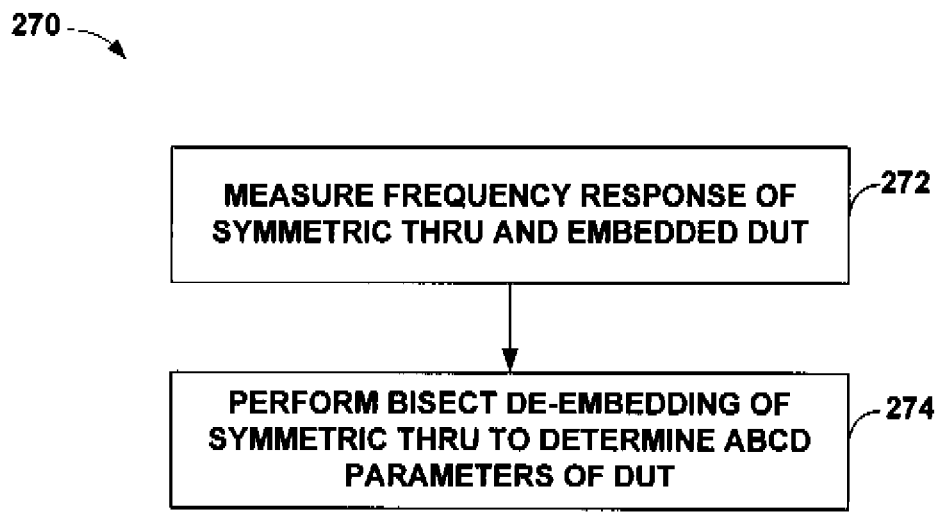
FIG. 29 is a flowchart illustrating an example process by which the ABCD parameters of the DUT may be determined based on the ABCD parameters of the substantially symmetric THRU.

FIG. 29 is a flowchart illustrating an example process (270) by which the ABCD parameters of the DUT may be determined based on the ABCD parameters of the substantially symmetric THRU. The frequency response (e.g., s-parameters over the desired frequency range) of the substantially symmetric THRU with the embedded DUT are measured (272). The ABCD parameters of the DUT are determined using bisect de-embedding based on the ABCD parameters of the substantially symmetric THRU (274). The bisect de-embedding may be performed via a programmed bisect de-embedding software such as bisect de-embedding software module 184 shown in FIG. 19. Bisect de-embedding module may be stored and/or executed by computer 180 or a controller internal to VNA 160, for example.

Figure 30:
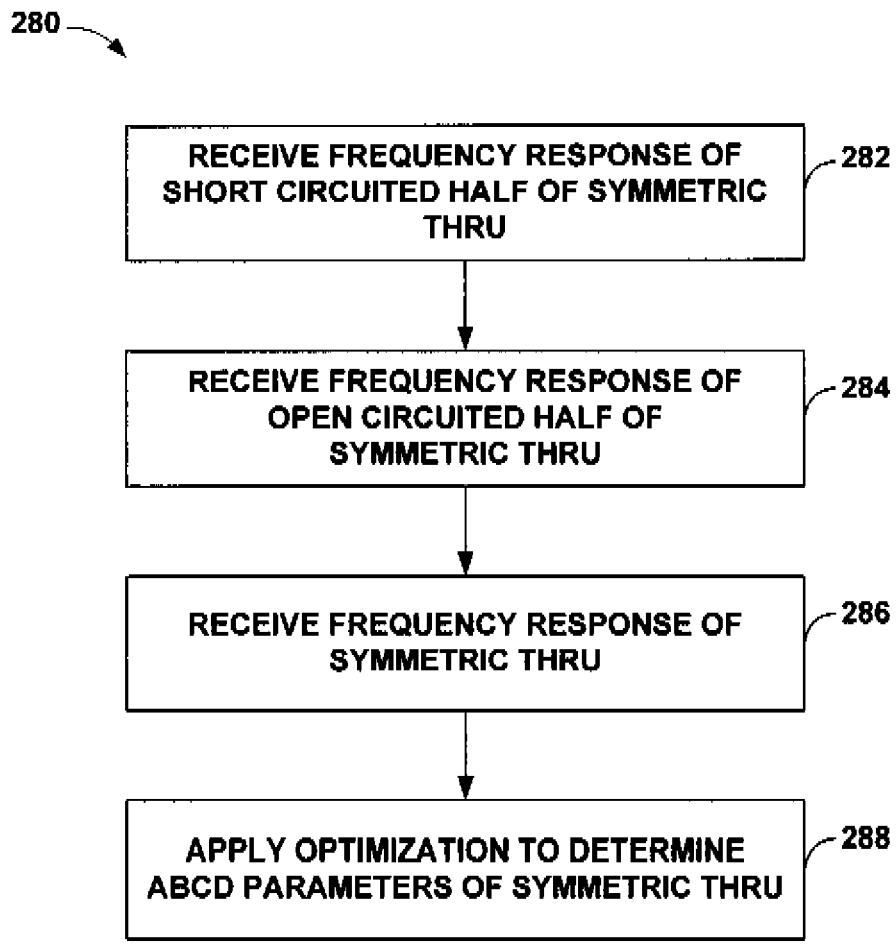
FIG. 30 is a flowchart illustrating an example process by which an ABCD optimization module may determine the ABCD parameters of a substantially symmetric THRU using one or both of a SHORT or OPEN.

FIG. 30 is a flowchart illustrating an example process (270) by which ABCD optimization module, such as ABCD optimization module 182 shown in FIG. 19, may determine the ABCD parameters of a substantially symmetric THRU using one or both of a SHORT or OPEN. To that end, either one or both of the SHORT (282) or the OPEN (284) techniques may be used. In an example where the SHORT technique is used, optimization module 182 receives the frequency response (e.g., s-parameters over the desired frequency range) of the short-circuited half of the symmetric THRU (282). In an example where the OPEN technique is used, optimization module 182 receives the frequency response (e.g., s-parameters over the desired frequency range) of the open-circuited half of the symmetric THRU (284). Optimization module 182 also receives the frequency response (e.g., s-parameters over the desired frequency range) of the substantially symmetric THRU (286). The various s-parameter measurements may be obtained via a vector network analyzer (VNA) such as VNA 160 of FIG. 19, or by other methods.

Once the frequency response of the SHORT and/or the OPEN and the substantially symmetric THRU are obtained, optimization module 182 determines the ABCD parameters of the substantially symmetric THRU based on the measured frequency response of the substantially symmetric THRU and one or both of the frequency response of the SHORT or the frequency response of the OPEN (288).

Figure 31:
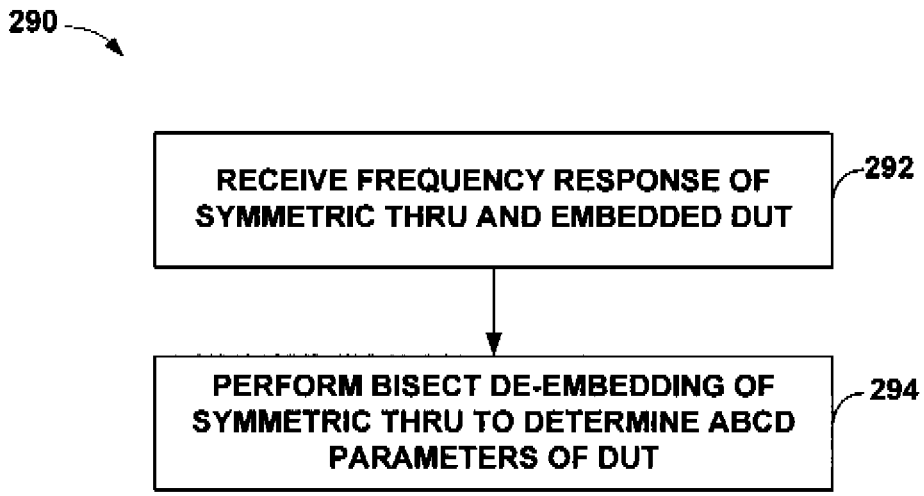
FIG. 31 is a flowchart illustrating an example process by which bisect de-embedding module 184 may determine the ABCD parameters of a DUT.

FIG. 31 is a flowchart illustrating an example process (290) by which bisect de-embedding module 184 may determine the ABCD parameters of a DUT. Bisect de-embedding module 184 receives the ABCD parameters of the substantially symmetric THRU as determined by the ABCD optimization module 182 (292). Bisect de-embedding module 184 determines the ABCD parameters of the DUT based on the ABCD parameters of the substantially symmetric THRU (294).

Figure 32:
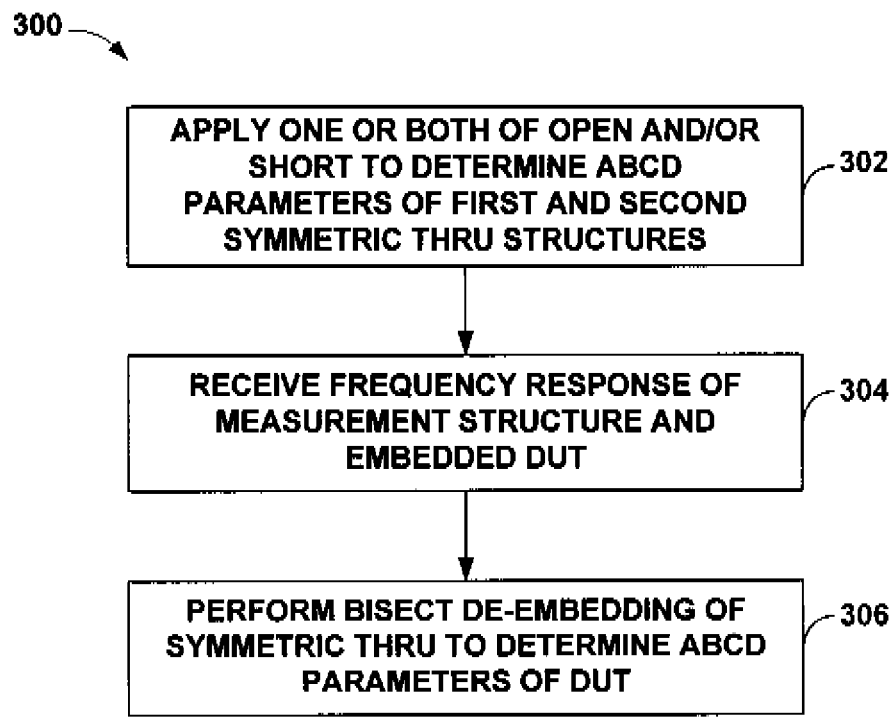
FIG. 32 is a flowchart illustrating an example process by which bisect de-embedding module 184 may determine the ABCD parameters of a DUT in a measurement structure including a first half of a first substantially symmetric THRU structure and a second half of a second substantially symmetric THRU structure using OPEN and/or SHORT techniques.

FIG. 32 is a flowchart illustrating an example process (300) by which bisect de-embedding module 184 may determine the ABCD parameters of a DUT in a measurement structure such as that shown in FIGS. 14A-14C using OPEN and/or SHORT techniques. In FIGS. 14A-14C, first and second THRU structures, THRU1 50 and THRU2 60, are each substantially symmetric but are dissimilar to each other. A first half of the first substantially symmetric THRU structure 50 and a second half of the second substantially symmetric THRU structure 60 form the two port measurement structure shown in FIG. 14C. The resulting measurement structure shown in FIG. 14C is therefore not itself symmetric about the device under test. In this example, the process (250) shown in FIG. 28 may be used to determine the ABCD parameters of each of the first and second symmetric THRU structures, such as first and second symmetric THRU structures 50 and 60, using one or both of the OPEN and/or SHORT techniques (302). The frequency response (e.g., s-parameters over the desired frequency range) of the measurement structure including a first half of a first symmetric THRU structure and a second half of a second substantially symmetric THRU structure with the embedded DUT is measured (304). The ABCD parameters of the DUT are determined using bisect de-embedding based on the ABCD parameters of the first and second substantially symmetric THRU structures (306).

The techniques described herein may be implemented in hardware, software, firmware, or any combination thereof. The techniques described herein may be embodied as a computer-readable medium that includes instructions for causing a programmable processor to carry out the methods described above. For example, the computer readable medium may comprise random access memory (RAM), read-only memory (ROM), non-volatile random access memory (NVRAM), electrically erasable programmable read-only memory (EEPROM), flash memory, CD, DVD, magnetic or optical media, or the like. The instructions may be implemented as one or more software modules, which may be executed by themselves or in combination with other software.

The instructions and the media are not necessarily associated with any particular computer or other apparatus, but may be carried out by various general-purpose or specialized machines. The instructions may be distributed among two or more media and may be executed by two or more machines. The machines may be coupled to one another directly, or may be coupled through a network, such as a local access network (LAN), or a global network such as the Internet.

The techniques described herein may be embodied as one or more devices that include logic circuitry to carry out the functions or methods as described herein. The logic circuitry may include a processor that may be programmable for a general purpose or may be dedicated, such as microcontroller, a microprocessor, a Digital Signal Processor (DSP), Application Specific Integrated Circuit (ASIC), and the like.

Various examples have been described. These and other examples are within the scope of the following claims.

The invention claimed is:

1. A method comprising:
   measuring transmission characteristics of a substantially symmetric two-port network including a first half and a second half;
   measuring at least one of transmission characteristics of the first half of the substantially symmetric two-port network having a short-circuited output and transmission characteristics of the first half of the substantially symmetric two-port network having an open-circuited output;
   determining transmission characteristics of the substantially symmetric two-port network based on the transmission characteristics of the substantially symmetric two-port network and one or both of the transmission characteristics of the first half of the substantially symmetric two-port network having a short-circuited output and the transmission characteristics of the first half of the substantially symmetric two-port network having an open-circuited output;
   measuring transmission characteristics of the substantially symmetric two-port network having a device under test embedded between the first half and the second half; and
   mathematically removing the transmission characteristics of the first half of the first substantially symmetric two-port network and the second half of the second substantially symmetric two-port network from the measured transmission characteristics of the substantially symmetric two-port network having a device under test embedded between the first half and the second half to determine transmission characteristics of the device under test.

2. The method of claim 1 further comprising:
   measuring transmission characteristics of a measurement structure including the substantially symmetric two-port network and an embedded device under test; and
   determining transmission characteristics of the device under test based on the transmission characteristics of the substantially symmetric two-port network and the transmission characteristics of the measurement structure.

3. The method of claim 1 further comprising accounting for parasitic capacitances involved with the open-circuited output.

4. The method of claim 1 further comprising accounting for parasitic inductances involved with the short-circuited output.

5. The method of claim 1 wherein measuring transmission characteristics of the substantially symmetric two-port network comprises measuring s-parameters of the substantially symmetric two-port network.

6. The method of claim 1 further comprising measuring at least one of transmission characteristics of the second half of the substantially symmetric two-port network having a short-circuited output and transmission characteristics of the second half of the substantially symmetric two-port network having an open-circuited output.

7. The method of claim 6 further comprising determining transmission characteristics of the substantially symmetric two-port network based on the transmission characteristics of the substantially symmetric two-port network and one or both of the transmission characteristics of the second half of the substantially symmetric two-port network having a short-circuited output and the transmission characteristics of the second half of the substantially symmetric two-port network having an open-circuited output.

8. A method comprising:
   measuring a first set of s-parameters of a substantially symmetric two-port network including a first half and a second half;
   measuring at least one of a second set of s-parameters of the first half of the substantially symmetric two-port network having a short-circuited output and a third set of s-parameters of the first half of the substantially symmetric two-port network having an open-circuited output; and
   determining ABCD parameters of the substantially symmetric two-port network based on the first set of s-parameters and one or both of the second and third set of s-parameters;
   measuring a fourth set of s-parameters of the substantially symmetric two-port network having a device under test embedded between the first half and the second half; and
   determining ABCD parameters of the device under test based on the first set of s-parameters of the substantially symmetric two-port network and the fourth set of s-parameters.

9. The method of claim 8 wherein determining ABCD parameters of the device under test further includes mathematically removing the s-parameters of the first half of the symmetric two-port network and mathematically removing the s-parameters of the second half of the symmetric two-port network from the s-parameters of the measurement structure.

10. The method of claim 9 wherein mathematically removing the frequency response of the first half of the symmetric two-port network and mathematically removing the frequency response of the second half of the symmetric two-port network comprises solving a matrix equation $A_{DUT} = A_{BIS1}^{-1} \cdot A_{MEAS} \cdot (\overline{A_{BIS22}})^{-1}$, wherein $A_{DUT}$ represents a transmission matrix of the embedded device under test, $A_{MEAS}$ represents a transmission matrix of the embedded device under test and the measurement structure, $A_{BIS1}$ represents a transmission matrix of the first half of the symmetric two-port network, and $\overline{A_{BIS2}}$ represents a transmission matrix of the second half of the symmetric two-port network.

11. A method comprising:
   measuring transmission characteristics of a first substantially symmetric two-port network structure including a first half and a second half;
   measuring transmission characteristics of the first half of the first substantially symmetric two-port network structure having one of a short-circuited output or an open circuited output;

measuring transmission characteristics of a second substantially symmetric two-port network structure including a first half and a second half;

measuring transmission characteristics of the first half of the second substantially symmetric two-port network structure having one of a short-circuited output or an open circuited output;

measuring transmission characteristics of a measurement structure containing a device under test embedded between the first half of the first substantially symmetric two-port network structure and the second half of the second substantially symmetric two-port network structure; and mathematically removing the transmission characteristics of the first half of the first substantially symmetric two-port network structure and the second half of the second substantially symmetric two-port network structure from the measured transmission characteristics of the measurement structure to determine transmission characteristics of the device under test.

12. The method of claim 11 wherein measuring the transmission characteristics of a substantially symmetric two-port network comprises measuring s-parameters of the substantially symmetric two-port network.

13. The method of claim 11 further comprising measuring at least one of transmission characteristics of the second half of the substantially symmetric two-port network having a short-circuited output and transmission characteristics of the second half of the substantially symmetric two-port network having an open-circuited output.

14. The method of claim 11 further comprising determining transmission characteristics of the substantially symmetric two-port network based on the transmission characteristics of the substantially symmetric two-port network and one or both of the transmission characteristics of the second half of the substantially symmetric two-port network having a short-circuited output and the transmission characteristics of the second half of the substantially symmetric two-port network having an open-circuited output.

15. A non-transitory computer-readable medium comprising instructions to cause a processor to:

measure transmission characteristics of a substantially symmetric two-port network THRU including a first half and a second half;

measure at least one of transmission characteristics of the first half of the substantially symmetric two-port network having a short-circuited output and transmission characteristics of the first half of the substantially symmetric two-port network having an open-circuited output;

determine transmission characteristics of the substantially symmetric two-port network based on the transmission characteristics of the substantially symmetric two-port network and one or both of the transmission characteristics of the first half of the substantially symmetric two-port network having a short-circuited output and the transmission characteristics of the first half of the substantially symmetric two-port network having an open-circuited output;

measure transmission characteristics of a measurement structure containing a device under test embedded between the first half of the first substantially symmetric structure and the second half of the second substantially symmetric structure; and mathematically remove the transmission characteristics of the first half of the first substantially symmetric structure and the second half of the second substantially symmetric structure from the measured transmission characteristics of the measurement structure to determine transmission characteristics of the device under test.

16. The non-transitory computer readable medium of claim 15 further including instructions to cause a processor to account for parasitic capacitances involved with the open circuited output.

17. The non-transitory computer readable medium of claim 15 further including instructions to cause a processor to account for parasitic inductances involved with the short circuited output.

* * * * *